(12) United States Patent
Chou et al.

(10) Patent No.: US 12,055,591 B2
(45) Date of Patent: Aug. 6, 2024

(54) BATTERY MANAGEMENT CONTROLLERS CAPABLE OF DETERMINING ESTIMATE OF STATE OF CHARGE

(71) Applicant: O2Micro, Inc., Santa Clara, CA (US)

(72) Inventors: Chih-Chung Chou, Taipei (TW); Guoxing Li, Sunnyvale, CA (US); Hua-Yi Wang, Taipei (TW); Fu-Jen Hsieh, Taipei (TW); Lian Chen, Wuhan (CN)

(73) Assignee: O2Micro Inc., Santa Clara, CA (US)

( * ) Notice: Subject to any disclaimer, the term of this patent is extended or adjusted under 35 U.S.C. 154(b) by 409 days.

(21) Appl. No.: 17/182,087

(22) Filed: Feb. 22, 2021

(65) Prior Publication Data
US 2021/0270906 A1    Sep. 2, 2021

(30) Foreign Application Priority Data

Feb. 27, 2020   (CN) .......................... 202010124840.4
Feb. 12, 2021   (EP) ..................................... 21156794
Feb. 12, 2021   (GB) ..................................... 2102003

(51) Int. Cl.
*G01R 31/3842*   (2019.01)
*G01R 31/367*    (2019.01)
*H02J 7/00*      (2006.01)

(52) U.S. Cl.
CPC ....... *G01R 31/3842* (2019.01); *G01R 31/367* (2019.01); *H02J 7/0048* (2020.01)

(58) Field of Classification Search
None
See application file for complete search history.

(56) References Cited

U.S. PATENT DOCUMENTS 6,832,171 B2   12/2004   Barsoukov et al.
7,856,328 B2   12/2010   Barsoukov et al.
(Continued)

FOREIGN PATENT DOCUMENTS

CN   102104259 A   6/2011
CN   102262216 A   11/2011
(Continued)

OTHER PUBLICATIONS

Farmann Alexander et al: "Critical review of o-board capacity estimation techniques for lithium-ion batteries in electric and hybrid electric vehicles", Journal of Power Sources, Elsevier SA, CH, vol. 281, Jan. 22, 2015, pp. 114-130, XP029142623, ISSN: 0378-7753, DOI: 10. 1016/J.JPOWSOUR.2015.01.129.

*Primary Examiner* — Brent A. Fairbanks

(57) ABSTRACT

In a battery management controller, analog-to-digital conversion circuitry converts analog signals, indicative of a battery voltage, a battery current, and a battery temperature, to digital signals. A memory stores a remaining-capacity lookup table that includes multiple groups of data. Each group of data includes a voltage, a current, a temperature, and a parameter associated with a remaining capacity corresponding to the voltage, the current and the temperature. A processor searches the lookup table for a current parameter value and an end-of-discharge parameter value based on the digital signals, and determines a full available charge capacity of the battery based on the current parameter value and the end-of-discharge parameter value. The processor also counts the number of charges flowing through the battery based on a battery current. The processor further determines an available state of charge of the battery according to the full available charge capacity and the number of charges.

20 Claims, 12 Drawing Sheets

(56) References Cited

U.S. PATENT DOCUMENTS

| | | |
|---|---|---|
| 9,494,656 B2 | 11/2016 | Yao |
| 10,444,296 B2 | 10/2019 | Miyamoto et al. |
| 10,534,037 B2 | 1/2020 | Yi et al. |
| 2003/0146756 A1* | 8/2003 | Yugo .................. G01R 19/0092 324/444 |
| 2005/0046389 A1 | 3/2005 | Kim |
| 2008/0233469 A1 | 9/2008 | Drozdz et al. |
| 2010/0076705 A1* | 3/2010 | Liu ....................... G01R 31/382 702/63 |
| 2010/0121591 A1* | 5/2010 | Hall ..................... G01R 31/367 702/63 |
| 2010/0289454 A1 | 11/2010 | Akabori et al. |
| 2011/0234167 A1* | 9/2011 | Kao .................... G01R 31/3828 320/132 |
| 2012/0105014 A1 | 5/2012 | Nakayama et al. |
| 2012/0223670 A1 | 9/2012 | Kinjo et al. |
| 2012/0323512 A1 | 12/2012 | Rhodin |
| 2014/0354213 A1* | 12/2014 | Rivera-Poventud ........................ H02J 7/0016 320/136 |
| 2015/0231986 A1 | 8/2015 | Li |
| 2015/0357852 A1* | 12/2015 | Nakao .................. G01R 31/392 702/63 |
| 2016/0041229 A1 | 2/2016 | Park et al. |
| 2016/0047861 A1* | 2/2016 | Chen ..................... H02J 7/0047 324/426 |
| 2016/0124051 A1 | 5/2016 | Prasad et al. |
| 2016/0327613 A1 | 11/2016 | Tenmyo et al. |
| 2017/0370996 A1* | 12/2017 | Yoshida ............... G01R 31/392 |
| 2018/0120385 A1 | 5/2018 | Choi et al. |
| 2019/0107581 A1 | 4/2019 | Huang |
| 2020/0164763 A1* | 5/2020 | Holme .................... B60L 58/10 |
| 2020/0174081 A1* | 6/2020 | Du ..................... G01R 31/3648 |

FOREIGN PATENT DOCUMENTS

| | | |
|---|---|---|
| CN | 103852725 A | 6/2014 |
| CN | 105242215 A | 1/2016 |
| CN | 106772101 A | 5/2017 |
| EP | 2778697 A1 | 9/2014 |
| EP | 2793038 A2 | 10/2014 |
| EP | 3182552 A1 | 6/2017 |
| JP | 2014220236 A | 11/2014 |
| JP | WO2016038873 A1 | 6/2017 |
| TW | I673507 B | 10/2019 |
| WO | 2016059869 A1 | 4/2016 |

\* cited by examiner

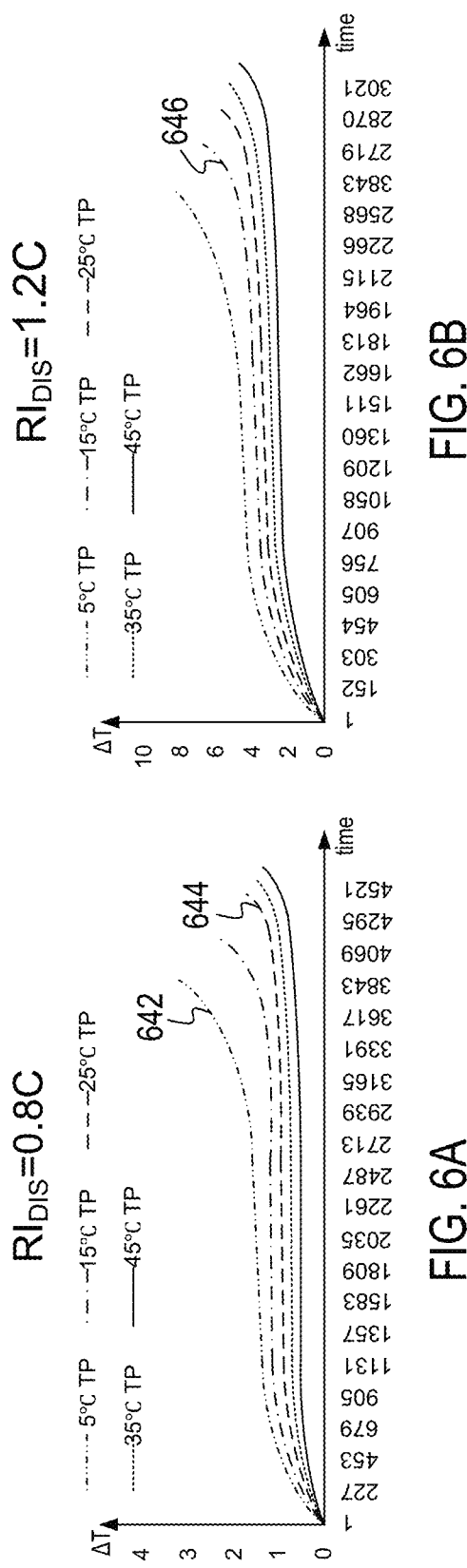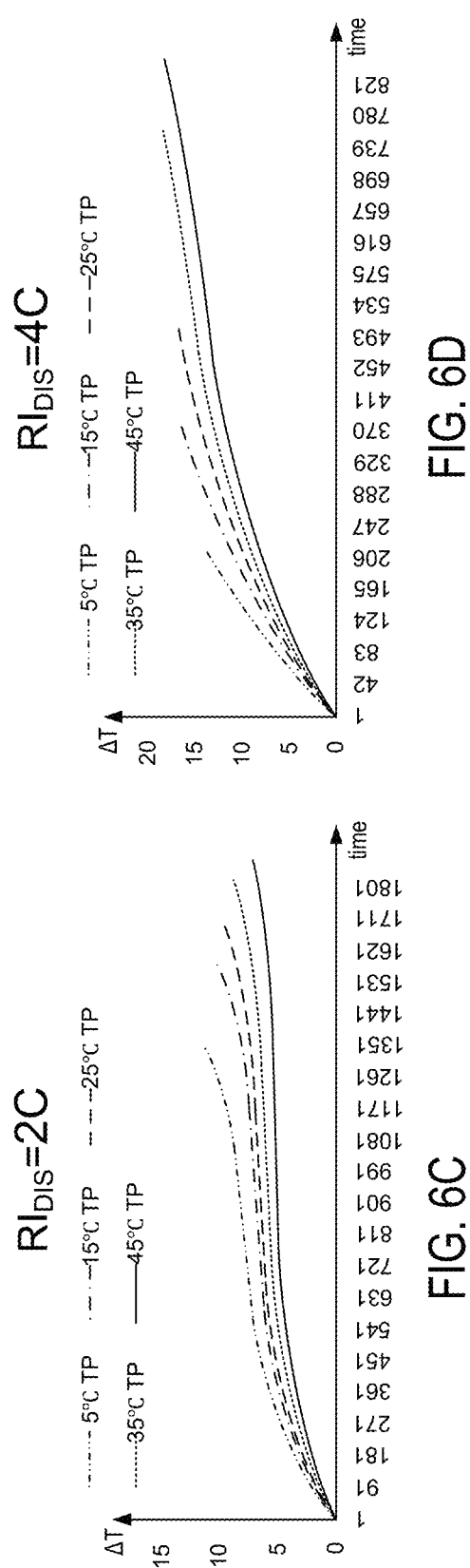

BATTERY MANAGEMENT CONTROLLERS CAPABLE OF DETERMINING ESTIMATE OF STATE OF CHARGE

REFERENCE TO RELATED APPLICATION

This application claims benefit under 35 U.S.C. § 119(a) to Application No. 202010124840.4, filed with the State Intellectual Property Office of the People's Republic of China on Feb. 27, 2020, Application No. 2102003.7, filed with the United Kingdom Intellectual Property Office on Feb. 12, 2021, and Application No. EP21156794.6, filed with the European Patent Office on Feb. 12, 2021, which are hereby incorporated by reference in their entirety.

BACKGROUND

Portable devices are widely used in daily lives, and it is important to estimate available state of charge (or relative state of charge; rSoC) of the batteries in the portable devices. A conventional method for estimating an available state of charge of a battery includes two steps. The first step includes counting the number of charges flowing through the battery using a coulomb counting method, obtaining an accumulated value of charges stored in the battery, and estimating the available state of charge of the battery based on the accumulated value. The second step includes searching a pre-stored lookup table for a remaining capacity that corresponds to a current battery voltage, a current battery current and a current battery temperature, and estimating the available state of charge based on the remaining capacity found in the lookup table. The first step is suited to a normal discharging state or a normal charging state of the battery. The second step is suited to the situations when the battery is close to an end-of-discharge state or a fully-charged state. However, due to non-ideality in practical situations, there are errors in the estimation of the available state of charge in the two steps respectively. These errors may result in the estimated value of the available state of charge changing abruptly when the battery transitions from the first step to the second step. Examples are illustrated in FIG. 1A and FIG. 1B.

FIG. 1A illustrates a plot of an estimated available state of charge of a battery in a discharging process, in a conventional battery management system. As shown in FIG. 1A, when the battery is in a normal discharging state (e.g., before time t1), the available state of charge rSoC is estimated based on the coulomb counting method. The available state of charge rSoC, as well as the battery voltage, decreases as the battery discharges. At time t1, the battery voltage decreases to a preset voltage level that is slightly greater than an end-of-discharge voltage of the battery, and therefore the battery enters a close-to-end-of-discharge state. In the close-to-end-of-discharge state, the available state of charge rSoC is estimated based on a pre-stored lookup table. Because the estimation methods used before time t1 and that after time t1 are independent from each other, and each method has a respective error, the available state of charge rSoC changes abruptly at time t1. The abrupt change may get larger and larger as the battery ages. The abrupt change can cause problems for users and/or shorten the battery's lifetime. For example, as shown in FIG. 1A, at time t0, a display screen of a portable device (e.g., a mobile phone) shows that the battery has 30% remaining power, based on which a user judges that the battery can last at least until time t3. Because the user may not be staring at the display screen all the time, the user may not notice the abrupt change. As a result, the portable device powers off unexpectedly at time t2. The battery can age faster if the battery experience full discharge cycles, e.g., the battery discharges until the portable device powers off. Additionally, because the display screen shows that the battery has 30% remaining power, the user attends an important conference call on time as planned. During the important conference call, however, the mobile phone powers off unexpectedly.

Similarly, FIG. 1B illustrates a plot of an estimated available state of charge of a battery in a charging process, in a conventional battery management system. When the battery is in a normal charging state (e.g., before time t4), the available state of charge rSoC is estimated based on a coulomb counting method, and as the battery is charged, the available state of charge rSoC, as well as the battery voltage, increases. At time t4, the battery voltage increases to a preset voltage level that is approximately equal to a fully-charged voltage of the battery, and the battery enters a close-to-fully-charged state. In the close-to-fully-charged state, the available state of charge rSoC is estimated based on a lookup table. Because the estimation methods used before time t4 and that after time t4 are independent from each other, and each method has a respective error, the available state of charge rSoC changes abruptly at time t4. The abrupt change may cause problems for users.

SUMMARY

In embodiments, a battery management controller includes analog-to-digital conversion circuitry, a memory, and a processor. The analog-to-digital conversion converts analog signals, indicative of a current battery voltage, a current battery current, and a current battery temperature of a battery, to digital signals. The memory stores a remaining-capacity lookup table that includes multiple groups of data. Each group of the groups of data includes a voltage, a current, a temperature, and a parameter associated with a remaining capacity that corresponds to the voltage, the current and the temperature. The processor receives a signal, indicative of a battery current, from the analog-to-digital conversion circuitry thereby counting the number of charges flowing through the battery. The processor also searches the remaining-capacity lookup table for a current parameter value corresponding to the current battery voltage, the current battery current, and the current battery temperature according the digital signals, searches the remaining-capacity lookup table for an end-of-discharge parameter value corresponding to an end-of-discharge voltage, the current battery current, and an end-of-discharge temperature, and determines an estimate of a current full available charge capacity of the battery according to a difference between the current parameter value and the end-of-discharge parameter value. The processor further determines an estimate of a current available state of charge of the battery according to the current full available charge capacity and the number of charges flowing through the battery.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

FIG. 6A illustrates examples of plots of temperature changes in different situations based on examples of experimental data, in embodiments of the present invention.

FIG. 6B illustrates examples of plots of temperature changes in different situations based on examples of experimental data, in embodiments of the present invention.

FIG. 6C illustrates examples of plots of temperature changes in different situations based on examples of experimental data, in embodiments of the present invention.

FIG. 6D illustrates examples of plots of temperature changes in different situations based on examples of experimental data, in embodiments of the present invention.

DETAILED DESCRIPTION

Figure 1A:
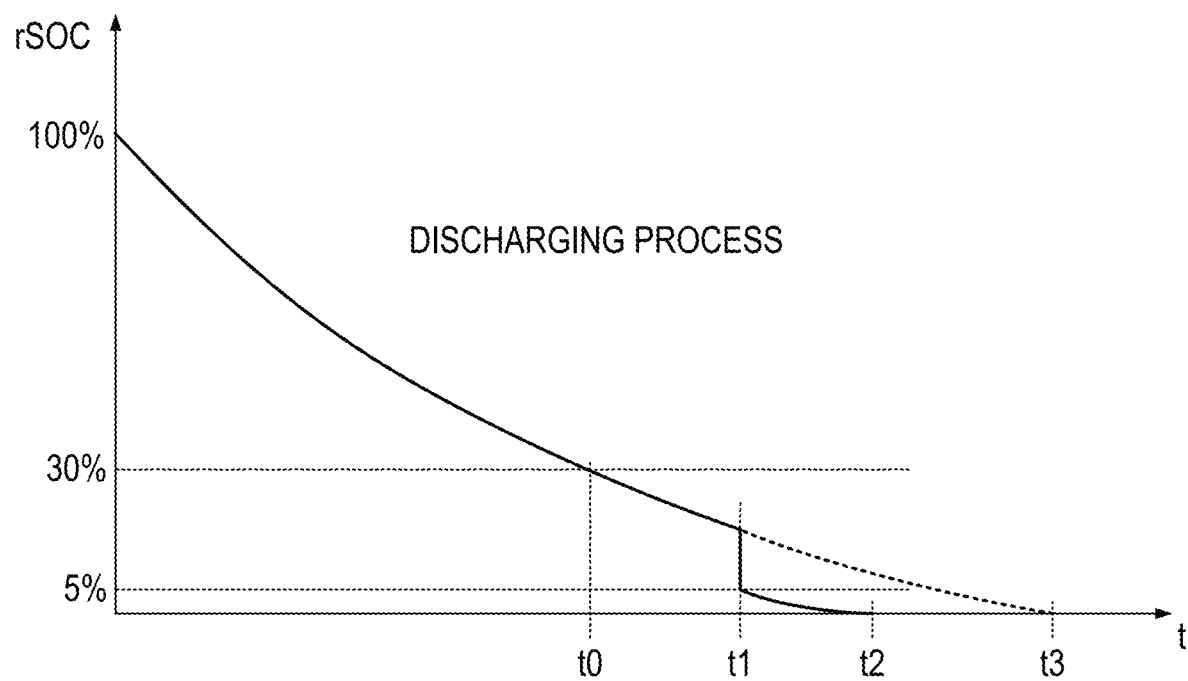
FIG. 1A illustrates a plot of estimated available state of charge of a battery versus time in a discharging process, in a conventional battery management system.
Figure 1B:
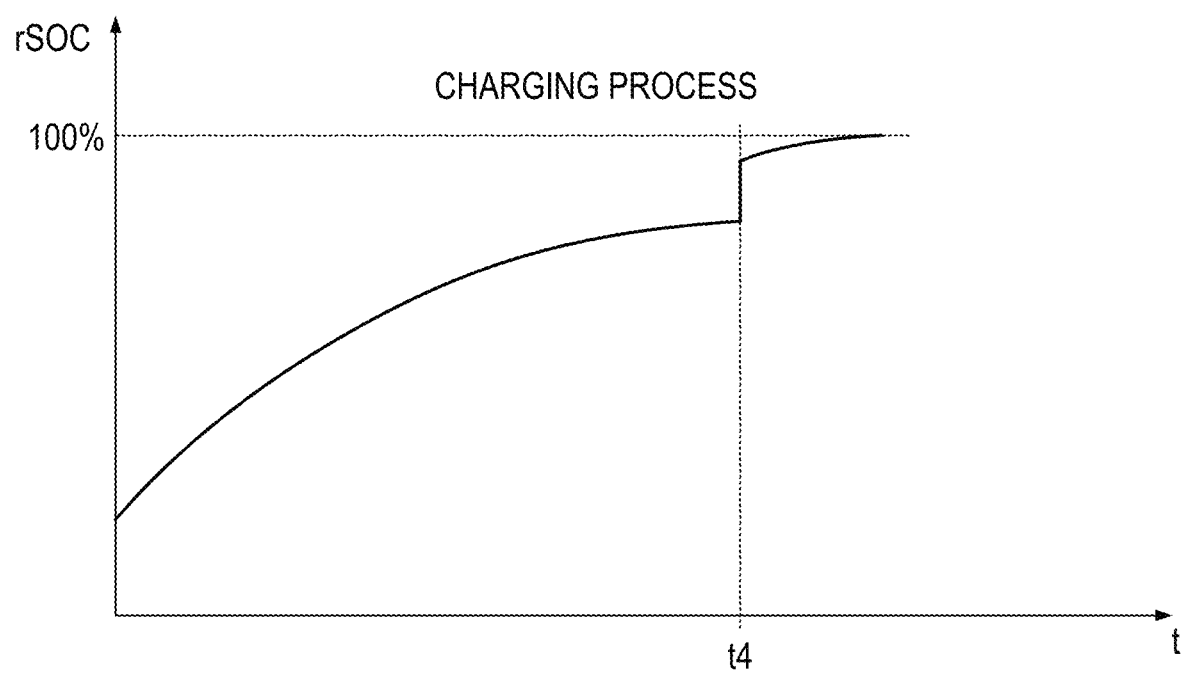
FIG. 1B illustrates a plot of estimated available state of charge of a battery versus time in a charging process, in a conventional battery management system.

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "accessing," "searching," "estimating," "counting," "updating," "obtaining," "determining," or the like, refer to actions and processes of a computer system or similar electronic computing device, controller, or processor. The computer system or similar electronic computing device manipulates and transforms data represented as physical (electronic) quantities within the computer system memories, registers or other such information storage, transmission or display devices.

Portions of the detailed description that follows are presented and discussed in terms of methods. Although steps and sequencing thereof are disclosed in figures herein describing the operations of those methods, such steps and sequencing are examples only. Embodiments are well suited to performing various other steps or variations of the steps recited in the flowcharts of the figures herein, and in a sequence other than that depicted and described herein.

Embodiments described herein may be discussed in the general context of computer-executable instructions residing on some form of computer-readable storage medium, such as program modules, executed by one or more computers, controllers, or other devices. By way of example, and not limitation, computer-readable storage media may comprise non-transitory computer storage media and communication media. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can be accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared and other wireless media. Combinations of any of the above can also be included within the scope of computer-readable media.

Embodiments of the present invention provide estimation methods for determining an estimate of an available state of charge (or a relative state of charge; rSoC) of a battery. The estimation method combines coulomb counting and a remaining-capacity lookup table in a specific way to estimate the available state of charge of the battery, thereby eliminating the abrupt change in the estimated value of the available state of charge that exists in the prior art. Thus, users can make more accurate judgments of the estimated available state of charge and on how to operate portable devices based on those judgments. For example, the user can charge the battery in the portable device before the portable device powers off. As a result, unexpectedly powering off of a portable device in a conventional battery management system can be avoided in an embodiment of the present invention. The battery's lifetime can be prolonged. In an embodiment, the battery includes a rechargeable battery such as a lithium ion battery, which provides renewable energy, and can help to reduce gas emission. Thus, solutions for providing users more accurate information for state of charge can help the users to prolong the battery's lifetime, and such solutions are beneficial.

Additionally, embodiments of the present invention provide improved methods for obtaining a more accurate available state of charge of the battery by determining an estimate of aging factors of the battery, and updating a full absolute charge capacity of the battery according to the aging factors. Moreover, embodiments of the present invention provide improved methods for obtaining a more accurate available state of charge of the battery by determining an estimate of an end-of-discharge temperature, and updating a dynamic full capacity of the battery based on the end-of-discharge temperature.

Figure 2A:
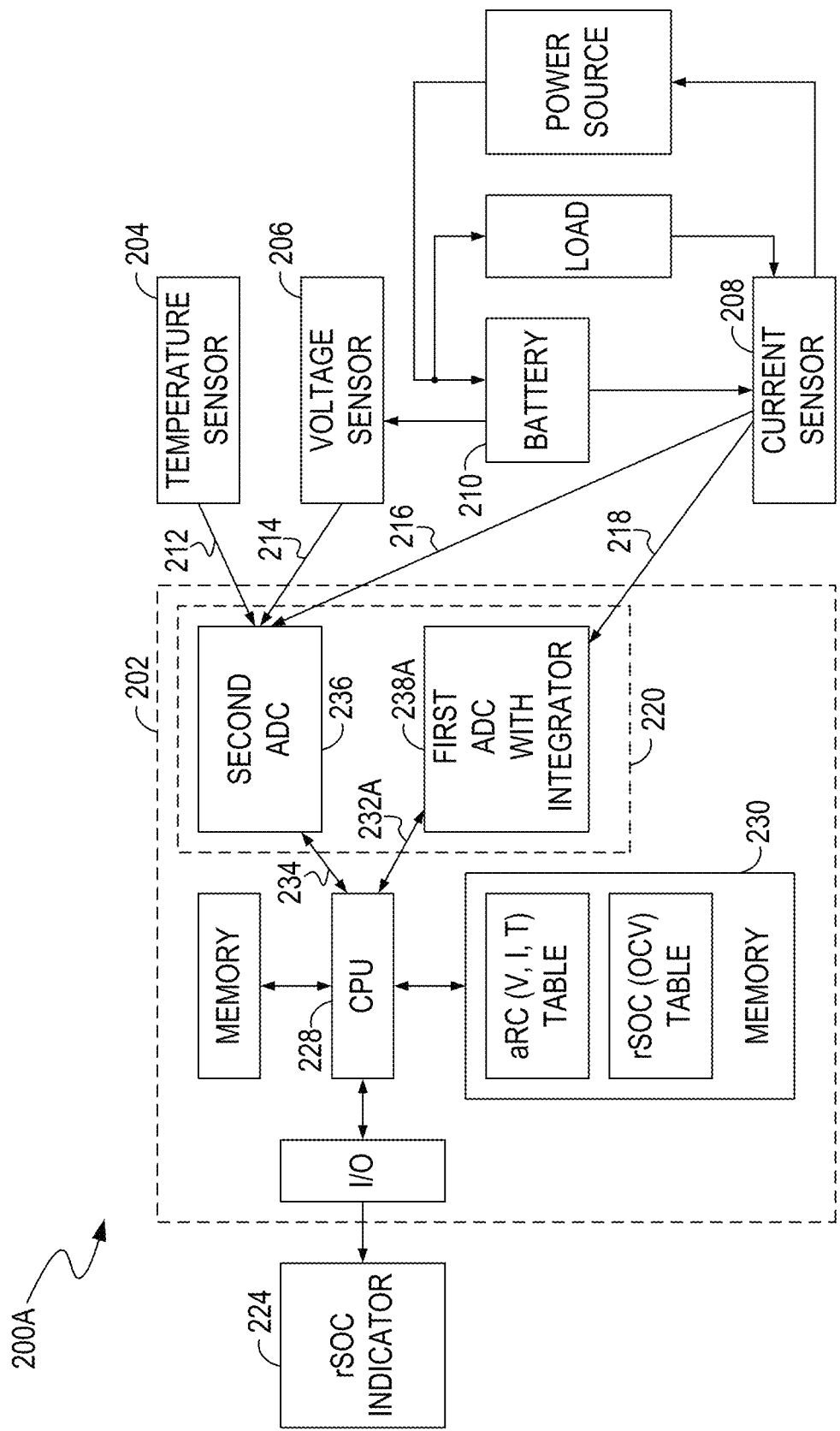
FIG. 2A illustrates a block diagram of an example of a battery management system that is capable of determining an estimate of a state of charge of a battery, in an embodiment of the present invention.

FIG. 2A illustrates a block diagram of an example of a battery management system 200A that is capable of determining an estimate of a state of charge of a battery 210, in an embodiment of the present invention. The battery management system 200A can monitor and control statuses of the battery 210. In an embodiment, the battery management system 200A monitors a temperature, a voltage, and a current of the battery 210 through sensing circuitry, e.g., including circuits 204, 206, and 208, and determines an estimate of an available state of charge of the battery 210 based on the temperature, voltage, and current. The battery management system 200A also controls an rSoC indicator 224, e.g., a display screen, to display the estimated value of the available state of charge in a percentage format. In an embodiment, the battery 210 includes one or more rechargeable battery cells (e.g., lithium ion battery cells).

More specifically, as shown in FIG. 2A, the battery management system 200A can include a temperature sensing circuit 204, a voltage sensing circuit 206, a current sensing circuit 208, and a battery management controller 202. The temperature sensing circuit 204 can include, but is not limited to, a thermistor that generates a first signal 212 indicative of a battery temperature TBAT of the battery 210. The voltage sensing circuit 206 can include, but is not limited to, a voltage divider, coupled to a positive terminal of the battery 210, and that generates a second signal 214 indicative of a battery voltage $V_{BAT}$ of the battery 210. The current sensing circuit 208 can include, but is not limited to, a sensing resistor, coupled in series to the battery 210. The current sensing circuit 208 can generate a third signal 216 and a fourth signal 218 indicative of a battery current IBAT of the battery 210. In an embodiment, the third signal 216 and the fourth signal 218 are generated from the same current sensing component, and therefore they are the same signal. In another embodiment, the third signal 216 and the fourth signal 218 can be generated by two separate current sensing components, and therefore they can be two different signals. The battery management controller 202 can receive signals 212, 214, 216, and 218 from the sensing circuits (e.g., including the sensing circuits 204, 206, and 208), and estimate the available state of charge of the battery 210 based on these signals. In an embodiment, the battery management controller 202 includes analog-to-digital conversion circuitry 220, a memory 230, and a processor 228.

In an embodiment, the analog-to-digital conversion circuitry 220 includes a first analog-to-digital converter 238A (hereinafter, ADC 238A) and a second analog-to-digital converter 236 (hereinafter ADC 236). The first ADC 238A can include a high-accuracy converter capable of obtaining relatively accurate information for the battery current. The first ADC 238A can convert an analog signal 218 from the current sensing circuit 208, indicative of a current battery current IN of the battery 210, to a computer-readable digital signal 232A. The second ADC 236 can include a high-speed converter capable of obtaining information for the battery temperature, battery voltage, and battery current relatively fast. In an embodiment, a speed of conversion of the second ADC 236 is higher/greater than a speed of conversion of the first ADC 238A. The second ADC 236 can convert analog signals 214, 216, and 222, indicative of a current battery voltage $V_N$ (or a real-time value of the battery voltage $V_{BAT}$), a current battery current IN (or a real-time value of the battery current IBAT), and a current battery temperature $T_N$ (or a real-time value of the battery temperature TBAT), to computer-readable digital signals 234. The processor 228 can estimate a state of charge SoC of the battery 210 based on the digital signals from the ADCs 236 and 238A, and based on parameters of the battery 210 such as a full charge capacity FCC and a remaining capacity RC.

In an embodiment, the full charge capacity FCC includes a full absolute charge capacity FACC and a full relative charge capacity FRCC. The full absolute charge capacity FACC refers to the total number of charges stored in a battery when the battery is fully charged. Additionally, the full absolute charge capacity FACC includes a predetermined full absolute charge capacity pFACC and an actual full absolute charge capacity. The predetermined full absolute charge capacity pFACC refers to a design value of the full absolute charge capacity FACC of a battery when the battery is brand new. The actual full absolute charge capacity FACC can decrease gradually as the battery ages. The full relative charge capacity FRCC can also be referred to as full available charge capacity or dynamic full capacity DFC. The full available charge capacity or the dynamic full capacity DFC refers to the number of charges that can be discharged from a battery when the battery is fully charged. More specifically, in an embodiment, when a battery powers a load, the battery's voltage $V_{BAT}$ decreases as the battery discharges. When the battery voltage $V_{BAT}$ decreases to an end-of-discharge voltage $V_{EOD}$ ($V_{EOD}>0$), the battery enters an end-of-discharge state, and the battery management system stops discharging the battery to protect the battery from over-discharging. The full available charge capacity DFC refers to the number of charges that are discharged from the battery from the time when the battery is fully charged to the time when the battery enters the end-of-discharge state.

In an embodiment, the remaining capacity RC includes an absolute remaining capacity aRC and a relative remaining capacity rRC. The absolute remaining capacity aRC refers to the total number of charges remaining in a battery. The relative remaining capacity rRC can also be referred to as available remaining capacity. The relative remaining capacity rRC (or available remaining capacity rRC) refers to the number of remaining charges that can be discharged from a battery until the battery enters the abovementioned end-of-discharge state. The state of charge SoC includes an absolute state of charge aSoC and a relative state of charge rSoC. The absolute state of charge aSoC refers to a ratio of the absolute remaining capacity aRC to the abovementioned predetermined full absolute charge capacity pFACC, e.g., aSoC=aRC/pFACC. The relative state of charge rSoC can also be referred to as available state of charge. The relative state of charge rSoC (or available state of charge rSoC) refers to a ratio of the available remaining capacity rRC to the abovementioned full available charge capacity DFC, e.g., rSoC=rRC/DFC.

In an embodiment, the memory 230 pre-stores a remaining-capacity lookup table aRC (V, I, T) and a state-of-charge lookup table rSoC (OCV). The remaining-capacity lookup table aRC (V, I, T) includes multiple groups of data. Each group includes data for a voltage V, a current I, a temperature T, and a parameter associated with a remaining capacity aRC that corresponds to the voltage V, current I, and temperature T. The parameter can include an absolute remaining capacity aRC and/or an absolute state of charge aSoC (e.g., aSoC=aRC/pFACC). More specifically, an absolute remaining capacity aRC, and similarly an absolute state of charge aSoC, of a battery have a corresponding relationship with the battery's voltage V, current I, and temperature T. In an embodiment, the corresponding relationship can be given by a specific function aRC=f(V, I, T) or aSoC=f(V, I, T). Thus, the absolute remaining capacity aRC can be obtained through the function aRC=f(V, I, T). Similarly, the absolute state of charge aSoC can be obtained through the function aSoC=f(V, I, T). In an embodiment, the specific function aRC=f(V, I, T) or aSoC=f(V, I, T) can also be represented by the lookup table aRC (V, I, T), and the abovementioned parameter in each group of data includes an absolute remaining capacity aRC or an absolute state of charge aSoC. Thus, the absolute remaining capacity aRC or the absolute state of charge aSoC can be obtained by searching the lookup table aRC (V, I, T).

In an embodiment, the state-of-charge lookup table rSoC (OCV) can also be referred to as a state-of-charge vs. open-circuit-voltage lookup table OCV-SOC, or open-circuit-voltage vs. state-of-charge lookup table SOC-OCV. The state-of-charge lookup table rSoC (OCV) includes multiple data groups, and each data group includes a voltage value OCV, e.g., an open-circuit voltage, and a state of charge rSoC corresponding to the voltage value OCV. More specifically, an available state of charge rSoC of a battery has a corresponding relationship with the battery's open-circuit voltage OCV, and the corresponding relationship can be indicated by the data stored in the lookup table rSoC (OCV). The available state of charge rSoC can be obtained by searching the lookup table rSoC (OCV).

The processor 228 can include a central processing unit, a microprocessor, a microcontroller, or a similar device that is capable of processing data and performing calculations. In an embodiment, the processor 228 receives a signal 232A, indicative of a current of the battery 210, from the first ADC 238A, thereby counting the number of charges Q(t) flowing through the battery 210. The processor 228 also receives digital signals 234 from the second ADC 236, and searches the remaining-capacity lookup table aRC (V, I, T) for a current absolute remaining capacity $aRC_N$ corresponding to a current battery voltage $V_N$, a current battery current $I_N$, and a current battery temperature $T_N$ according the digital signals 234, e.g., $aRC_N=f(V_N, I_N, T_N)$. The processor 228 also searches the lookup table aRC (V, I, T) for an end-of-discharge remaining capacity $aRC_{EOD}$ (hereinafter, EOD remaining capacity $aRC_{EOD}$) corresponding to an end-of-discharge voltage $V_{EOD}$, the current battery current $I_N$, and the current battery temperature $T_N$ (or an end-of-discharge temperature $T_{EOD}$). Additionally, the processor 228 determines an estimate of a current full available charge capacity DFC of the battery 210 according to a difference between the current absolute remaining capacity $aRC_N$ and the EOD remaining capacity $aRC_{EOD}$, and determines an estimate of a current available state of charge $rSoC_N$ of the battery 210 according to the current full available charge capacity DFC and the abovementioned number of charges Q(t).

More specifically, the number of charges Q(t) flowing through the battery 210 can be obtained by coulomb counting. The number of charges Q(t) can be given by equation (1) as follows:

$$Q(t) = \int_{t0}^{tn} I_N dt. \qquad (1)$$

In equation (1), $I_N$ represents a real-time value of the battery current.

In the example of FIG. 2A, the first ADC 238A includes an analog-to-digital converter with integral functionality. For example, the first ADC 238A can include an integration circuit that integrates the analog signal 218 to generate a ramp signal. The first ADC 238A can also include a comparison circuit that compares the ramp signal with a preset reference. When the ramp signal increases to the preset reference, the comparison circuit generates a result signal 232A (e.g., a logic-high signal or digital 1, or a logic-low signal or digital 0), and resets the ramp signal to generate a new ramp signal. As a result, the comparison circuit can output a set of result signals 232A. The frequency of the result signals 232A can increase if the battery current increases, and decrease if the battery current decreases. The processor 228 can count the result signals 232A, and the number of the result signals 232A can indicate the number of charges Q(t) flowing through the battery 210. Accordingly, the processor 228 can receive a signal 232A, indicative of an integral value of the battery current $I_N$, from the first ADC 238A, thereby obtaining the number of charges Q(t) flowing through the battery 210.

Figure 2B:
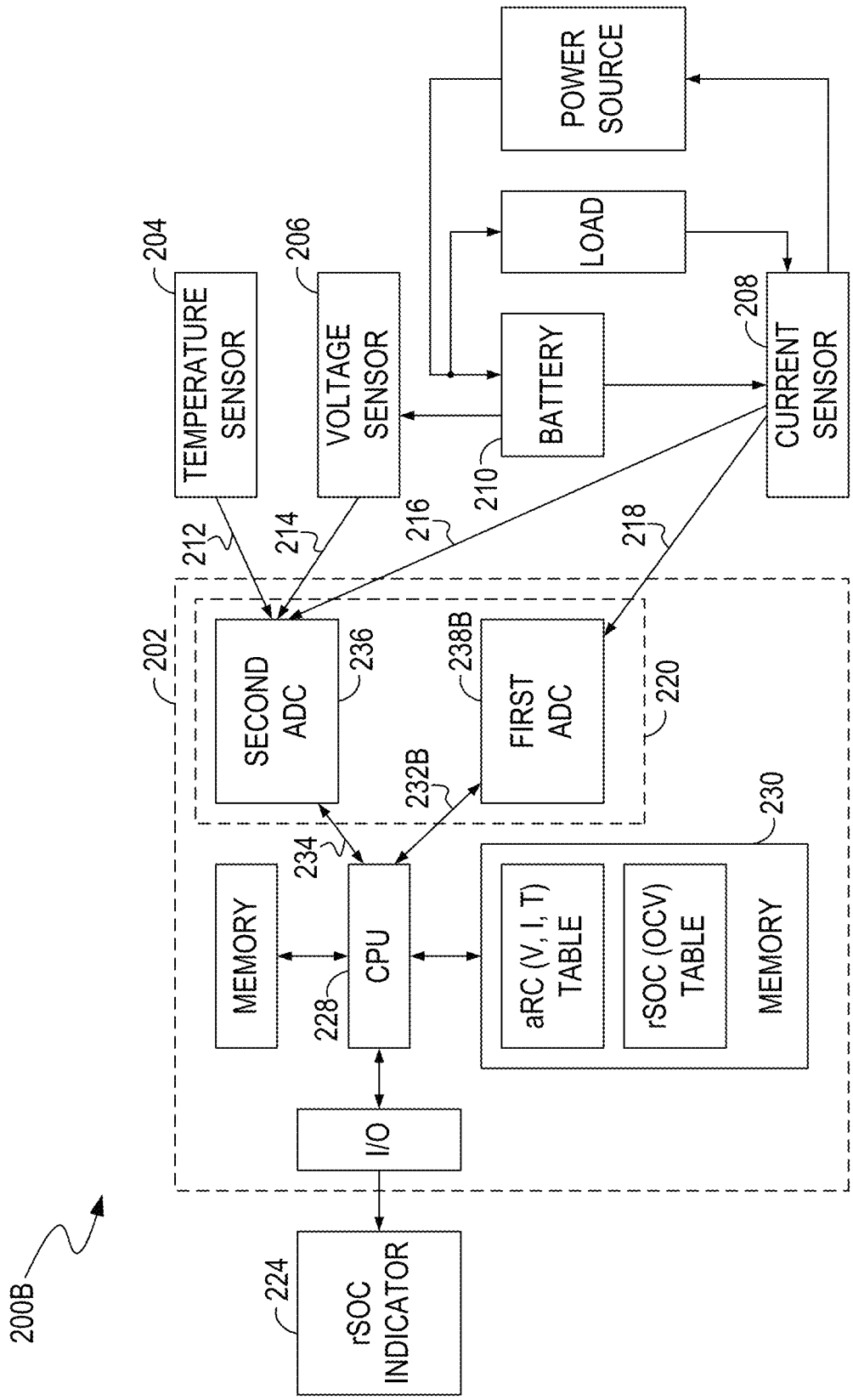
FIG. 2B illustrates a block diagram of an example of a battery management system that is capable of determining an estimate of a state of charge of a battery, in an embodiment of the present invention.

The invention is not limited to the example of FIG. 2A. In another example, as shown in FIG. 2B, the first ADC 238B does not have integration functionality, can convert the analog signal 218 to a set of binary codes 232B, and the value represented by the binary codes 232B can be proportional to the battery current $I_N$. The processor 228 can accumulate the values of multiple sets of binary codes 232B generated by the first ADC 238B, thereby calculating the number of charges Q(t) flowing through the battery 210. The abovementioned examples of methods of counting the number of charges Q(t) flowing through the battery 210 are for explanation purpose, and are not intended to limit the invention. In other embodiments, the number of charges Q(t) flowing through the battery 210 can be obtained by other methods.

In an embodiment, the processor 228 receives digital signals 234, converted from the analog signals 212, 214, and 216 by the second ADC 236, thereby obtaining the values of a current battery voltage $V_N$, a current battery current $I_N$, and a current battery temperature $T_N$. The processor 228 also searches the lookup table aRC (V, I, T) for a current absolute remaining capacity $aRC_N$ that corresponds to the current battery voltage $V_N$, the current battery current $I_N$, and the current battery temperature $T_N$. The current absolute remaining capacity $aRC_N$ can be represented by:

$$aRC_N = f(V_N, I_N, T_N). \quad (2a)$$

More specifically, in an embodiment, the processor 228 obtains the current absolute remaining capacity $aRC_N$ by searching the multiple groups of data in the lookup table aRC (V, I, T) for a corresponding group of data. The corresponding group of data includes a voltage V, a current I, and a temperature T that match the current battery voltage $V_N$, the current battery current $I_N$, and the current battery temperature $T_N$, respectively. In an embodiment, if a difference between a first value of a parameter and a second value of the parameter is less than a preset reference, then the first value is considered to match the second value. For example, if a difference between a voltage V in the lookup table aRC (V, I, T) and the current battery voltage $V_N$ is less than a preset reference, then that voltage V is considered to match the current battery voltage $V_N$. If the abovementioned corresponding group of data is found, then the processor 228 obtains (e.g., reads) the remaining capacity aRC in the corresponding group of data. The remaining capacity aRC in the corresponding group of data can be considered as the current absolute remaining capacity $aRC_N$.

In another embodiment, if the corresponding group of data is not found, then the processor 228 can perform a mathematical method, such as linear interpolation, to estimate the current absolute remaining capacity $aRC_N$. More specifically, in mathematics, linear interpolation is a method of curve fitting using linear polynomials to construct new data points within the range of a discrete set of known data points. In an embodiment, the lookup table aRC (V, I, T) may not include a voltage, a current, and/or a temperate that match the current battery voltage $V_N$, the current battery current $I_N$, and/or the current battery temperature $T_N$. In one such embodiment, the processor 228 can perform linear interpolation to construct a new set of data that matches the current battery voltage $V_N$, the current battery current $I_N$, and the current battery temperature $T_N$, according to the data in the lookup table aRC (V, I, T). The new set of data also includes a remaining capacity aRC, which can be considered as the current absolute remaining capacity $aRC_N$.

Additionally, as mentioned above, the battery 210 has an end-of-discharge voltage $V_{EOD}$. During a discharging process, when the battery voltage $V_N$ decreases to the end-of-discharge voltage $V_{EOD}$, the battery 210 enters an end-of-discharge state and stops discharging. In an embodiment, the temperature of the battery 210 can be relatively stable because, e.g., the discharge current of the battery 210 is relatively small. In one such embodiment, the temperature of the battery 210 at the time when the battery 210 enters the end-of-discharge state can be approximately equal to the current battery temperature $T_N$. The processor 228 can assume that the end-of-discharge temperature $T_{EOD}$ of the battery 210 will be equal to the current battery temperature $T_N$. Thus, the processor 228 can obtain an estimated value of an EOD remaining capacity $aRC_{EOD}$ of the battery 210 by searching the lookup table aRC (V, I, T) for a remaining capacity that corresponds to the end-of-discharge voltage $V_{EOD}$, the current battery current $I_N$, and the current battery temperature $T_N$:

$$aRC_{EOD} = f(V_{EOD}, I_N, T_N) \quad (2b)$$

More specifically, in an embodiment, the processor 228 searches the multiple groups of data in the lookup table aRC (V, I, T) for a corresponding group of data. The corresponding group of data includes a voltage V, a current I, and a temperature T that match the end-of-discharge voltage $V_{EOD}$, the current battery current $I_N$, and the current battery temperature $T_N$. If the corresponding group of data is found, then the remaining capacity aRC in the corresponding group of data can be considered as the EOD remaining capacity $aRC_{EOD}$. If the corresponding group of data is not found, then the processor 228 can perform linear interpolation to estimate the EOD remaining capacity $aRC_{EOD}$ based on the data in the lookup table aRC (V, I, T).

As a result, the processor 228 can estimate a current full available charge capacity DFC of the battery 210 according to the difference between the current absolute remaining capacity $aRC_N$ and the EOD remaining capacity $aRC_{EOD}$. By way of example, the processor 228 can estimate the current full available charge capacity DFC of the battery 210 according equation (2c) as follows:

$$DFC = FACC \times \frac{(aRC_N - aRC_{EOD})}{(pFACC \times rSOC_{N-1})}. \quad (2c)$$

In equation (2c), FACC represents a current full absolute charge capacity (e.g., indicative of an actual full absolute charge capacity) of the battery 210, pFACC represents a predetermined full absolute charge capacity of the battery 210, and $rSoC_{N-1}$ represents a previously determined available state of charge of the battery 210.

In addition, the processor 228 determines an estimate of a current available state of charge $rSoC_N$ of the battery 210 according to the current full available charge capacity DFC and the above-mentioned mount of charges Q(t) flowing through the battery 210. By way of example, the processor 228 can estimate the current available state of charge $rSoC_N$ of the battery 210 according to the following equation:

$$rSoC_N = \frac{(DFC \times rSoC_{N-1}) + Q(t)}{DFC}. \quad (3)$$

Accordingly, an embodiment of the present invention provides a method of combining coulomb counting and a remaining-capacity lookup table aRC (V, I, T) in a specific manner to estimate an available state of charge $rSoC_N$ of a battery. More specifically, in an embodiment, the processor 228 obtains the values of the current absolute remaining capacity $aRC_N$ and the EOD remaining capacity $aRC_{EOD}$ using the remaining-capacity lookup table aRC (V, I, T), thereby calculating the current full available charge capacity DFC according to equation (2c). The processor 228 also obtains the number of charges Q(t) flowing through the battery 210 by coulomb counting, and determines an estimate of the available state of charge $rSoC_N$ of the battery 210 by substituting the number of charges Q(t) and the current full available charge capacity DFC into equation (3). Thus, the abrupt change in the estimated value of the available state of charge rSoC in the prior art can be eliminated in an embodiment of the present invention. Users can therefore make more accurate judgments on how to operate the portable devices based on the estimated available state of charge rSoC.

In another embodiment, the abovementioned equation (2c) can be replaced by the following equation (4a). The processor 228 can estimate the current full available charge capacity DFC of the battery 210 according to the following equation:

$$DFC = FACC \times \frac{(aSoC_N - aSoC_{EOD})}{(rSoC_{N-1})}. \quad (4a)$$

In equation (4a), $aSoC_N$ represents a current absolute state of charge, e.g., a ratio of a current absolute remaining capacity $aRC_N$ to the predetermined full absolute charge capacity pFACC, of the battery 210, and $aSoC_{EOD}$ represents an end-of-discharge state of charge (hereinafter, EOD state of charge), e.g., a ratio of an EOD remaining capacity $aRC_{EOD}$ to the predetermined full absolute charge capacity pFACC, of the battery 210.

In an embodiment, the current absolute state of charge $aSoC_N$ can be obtained by dividing the current absolute remaining capacity $aRC_N$ that, as mentioned above, is obtained from the lookup table aRC (V, I, T), by the predetermined full absolute charge capacity pFACC, e.g., $aSoC_N = aSoC_N/pFACC$. Similarly, the EOD state of charge $aSoC_{EOD}$ can be obtained by dividing the EOD remaining capacity $aRC_{EOD}$ that, as mentioned above, is obtained from the lookup table aRC (V, I, T), by the predetermined full absolute charge capacity pFACC, e.g., $aSoC_{EOD} = aSoC_{EOD}/pFACC$. In equation (4a), the difference between the current absolute state of charge $aSoC_N$ and the EOD state of charge $aSoC_{EOD}$ indicates the difference between the current absolute remaining capacity $aRC_N$ and the EOD remaining capacity $aRC_{EOD}$.

In another embodiment, as mentioned above, the lookup table aRC (V, I, T) can include data for absolute state of charge $aSoC_N$. Thus, the processor 228 can obtain the current absolute state of charge $aSoC_N$ by searching the lookup table aRC (V, I, T) for a state of charge that corresponds to the current battery voltage $V_N$, the current battery current $I_N$, and the current battery temperature $T_N$. The current absolute state of charge $aSoC_N$ can be represented by:

$$aSOC_N = f(V_N, I_N, T_N) \quad (4b)$$

Similarly, the processor 228 can obtain the EOD state of charge $aSoC_{EOD}$ by searching the lookup table aRC (V, I, T) for a state of charge that corresponds to the end-of-discharge voltage $V_{EOD}$, the current battery current $I_N$, and the current battery temperature $T_N$. The EOD state of charge $aSoC_{EOD}$ can be represented by:

$$aSOC_{EOD} = f(V_{EOD}, I_N, T_N) \quad (4c)$$

Additionally, the processor 228 can estimate the current full available charge capacity DFC of the battery 210 based on a difference between the current absolute state of charge $aSoC_N$ and the EOD state of charge $aSoC_{EOD}$, e.g., by using equation (4a).

In an embodiment, as mentioned above, the temperature of the battery 210 can be relatively stable because, e.g., the discharge current of the battery is relatively small, and the battery temperature does not change significantly when the battery 210 enters the end-of-discharge state. Thus, the processor 228 can estimate the EOD remaining capacity $aRC_{EOD}$ (or the EOD state of charge $aSoC_{EOD}$) of the battery 210 by searching the lookup table aRC (V, I, T) for a remaining capacity (or a state of charge) corresponding to a current battery temperature. However, the invention is not so limited. In another embodiment, a discharge current of the battery 210 can be relatively large, which generates heat in the battery 210. In one such embodiment, the processor 228 can estimate an end-of-discharge temperature $T_{EOD}$ of the battery 210.

Figure 7:
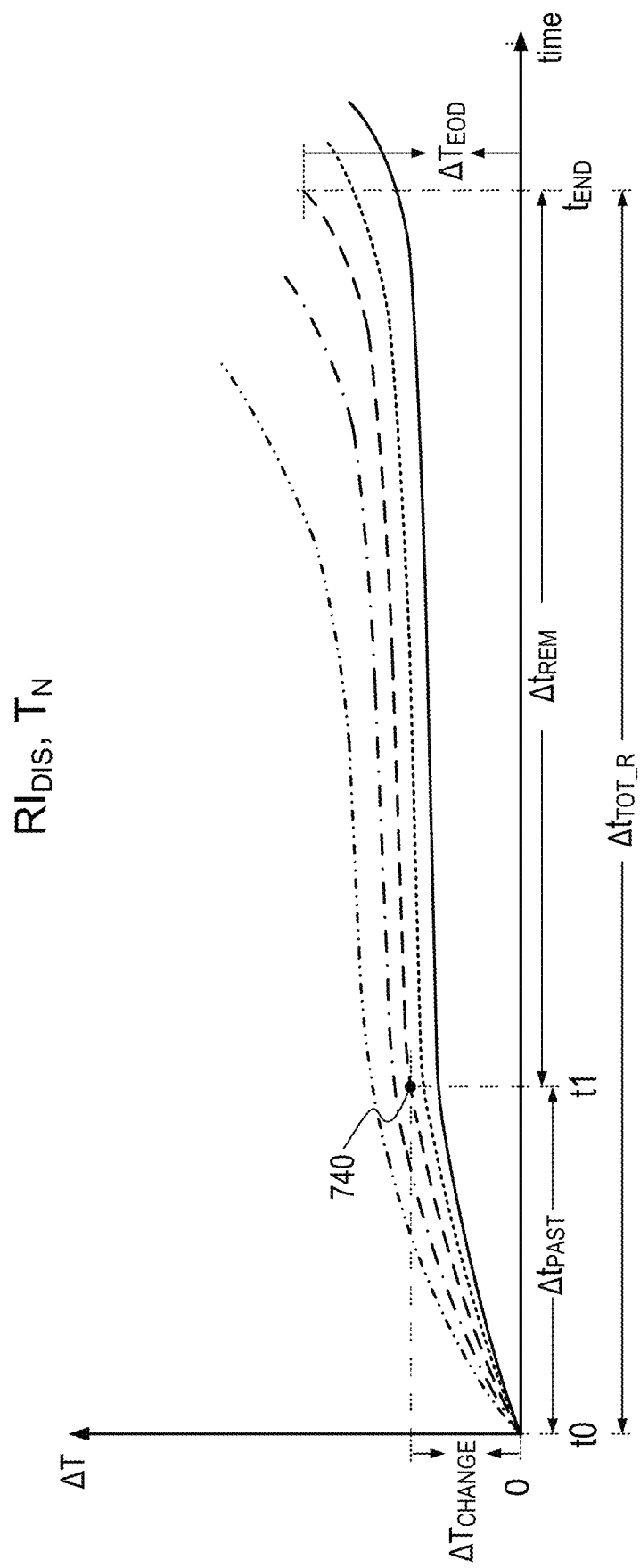
FIG. 7 illustrates examples of plots of temperature changes in different situations based on examples of experimental data, in embodiments of the present invention.
Figure 8:
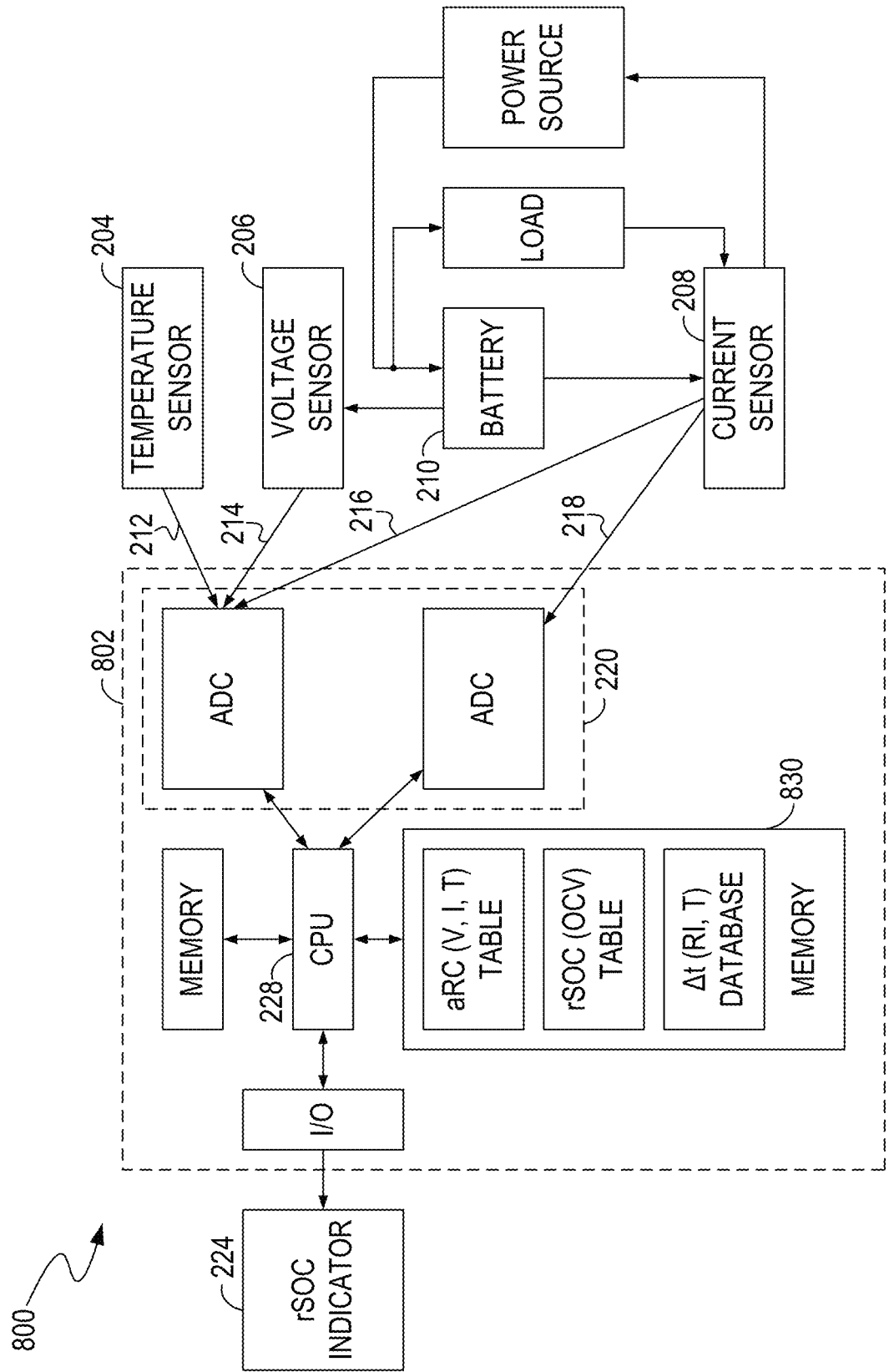
FIG. 8 illustrates a block diagram of an example of a battery management system, in an embodiment of the present invention.
Figure 9A:
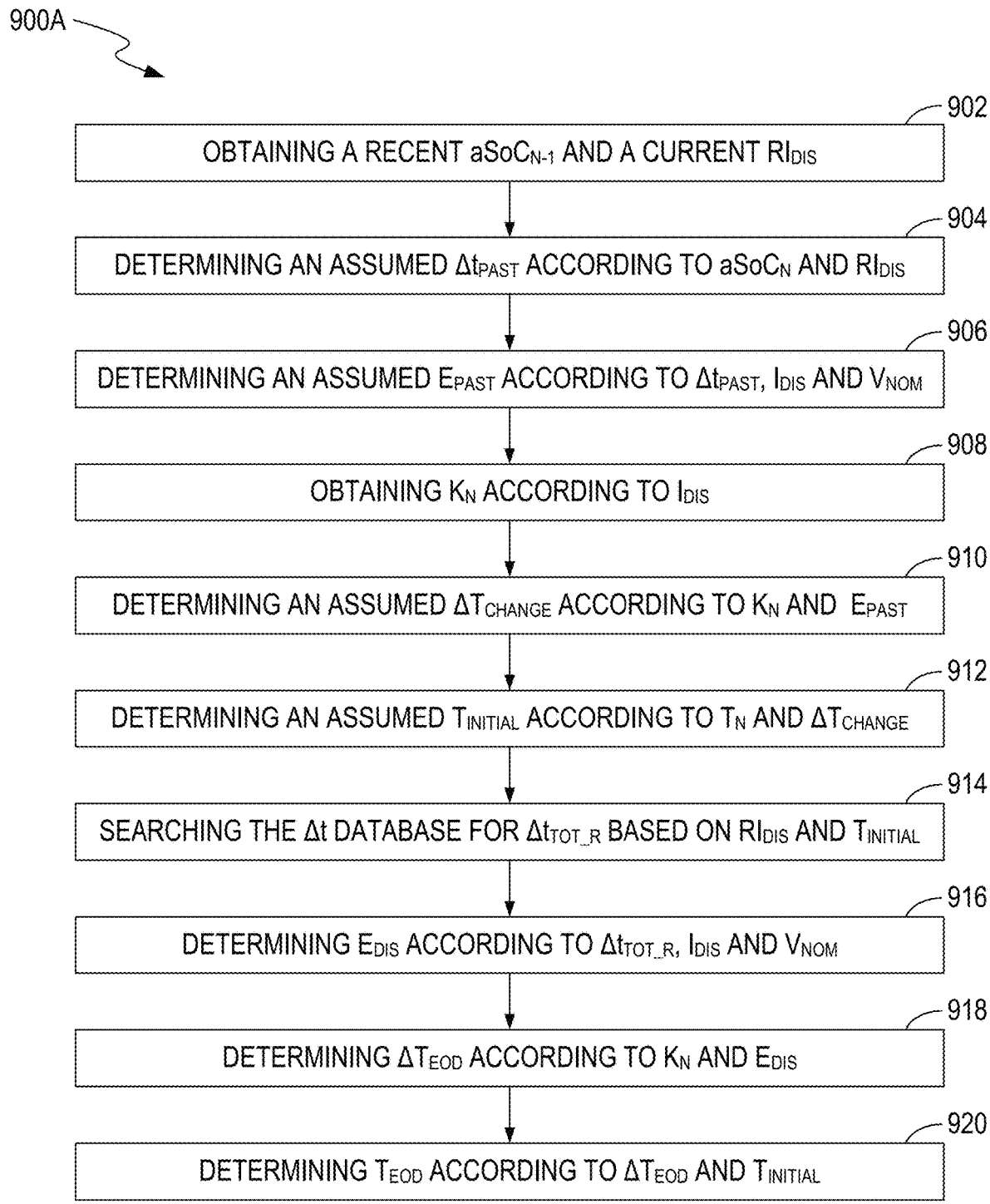
FIG. 9A illustrates a method of determining an estimate of an end-of-discharge temperature of a battery, in an embodiment of the present invention.

An example of a method of determining an estimate of the end-of-discharge temperature $T_{EOD}$ is described in FIG. 9A, in combination with FIG. 6A, FIG. 6B, FIG. 6C, FIG. 6D, FIG. 7, and FIG. 8. The processor 228 also determines an estimate of the EOD remaining capacity $aRC_{EOD}$ (or the EOD state of charge $aSoC_{EOD}$) of the battery 210 by searching the lookup table aRC (V, I, T) for a remaining capacity (or a state of charge) that corresponds to the end-of-discharge voltage $V_{EOD}$, the current battery current $I_N$, and the end-of-discharge temperature $T_{EOD}$, e.g., $aRC_{EOD} = f(V_{EOD}, I_N, T_{EOD})$ or $aSoC_{EOD} = f(V_{EOD}, I_N, T_{EOD})$. As a result, a more accurate EOD remaining capacity $aRC_{EOD}$ (or EOD state of charge $aSoC_{EOD}$) of the battery 210 can be obtained, and the processor 228 can use equation (3) and equation (2c) or (4a) to obtain a more accurate available state of charge $rSoC_N$ of the battery 210.

Moreover, in an embodiment, the processor 228 calculates aging factors of the battery 210 and updates a current full absolute charge capacity FACC (e.g., indicative of an actual full absolute charge capacity) of the battery 210 based on the aging factors. The processor 228 substitutes the updated current full absolute charge capacity FACC into equation (2c) or equation (4a), thereby updating a current full available charge capacity DFC of the battery 210. The processor 228 further substitutes the updated current full available charge capacity DFC into equation (3) to obtain a more accurate available state of charge rSoC. The aging factors include a charging aging factor AFC and a discharging aging factor AFD.

More specifically, in an embodiment, ideally, when a battery is charging, a ratio of the number of charges $Q(t)_{CHG}$ flowing to the battery to the amount of change $\Delta rSoC$ in the available state of charge of the battery is constant, e.g., does not change. However, in a practical situation, the ratio $Q(t)_{CHG}/\Delta rSoC$ can change, e.g., decrease, as the battery ages. The ratio $Q(t)_{CHG}/\Delta rSoC$ can be referred to as a charging aging factor AFC, e.g., $AFC = Q(t)_{CHG}/\Delta rSoC$. Additionally, in an embodiment, when a battery starts discharging, the battery's voltage $V_{BAT}$ can drop from an initial open-circuit voltage OCV to a lower battery voltage by an amount $\Delta V$. Ideally, a ratio of the voltage drop $\Delta V$ to the battery's discharge current $I_{DIS}$ is constant. However, in a practical situation, the ratio $\Delta V/I_{DIS}$ can change, e.g., decrease, as the battery ages. The ratio $\Delta V/I_{DIS}$ can be referred to as a discharging aging factor AFD (e.g., $AFD = \Delta V/I_{DIS}$).

Figure 3:
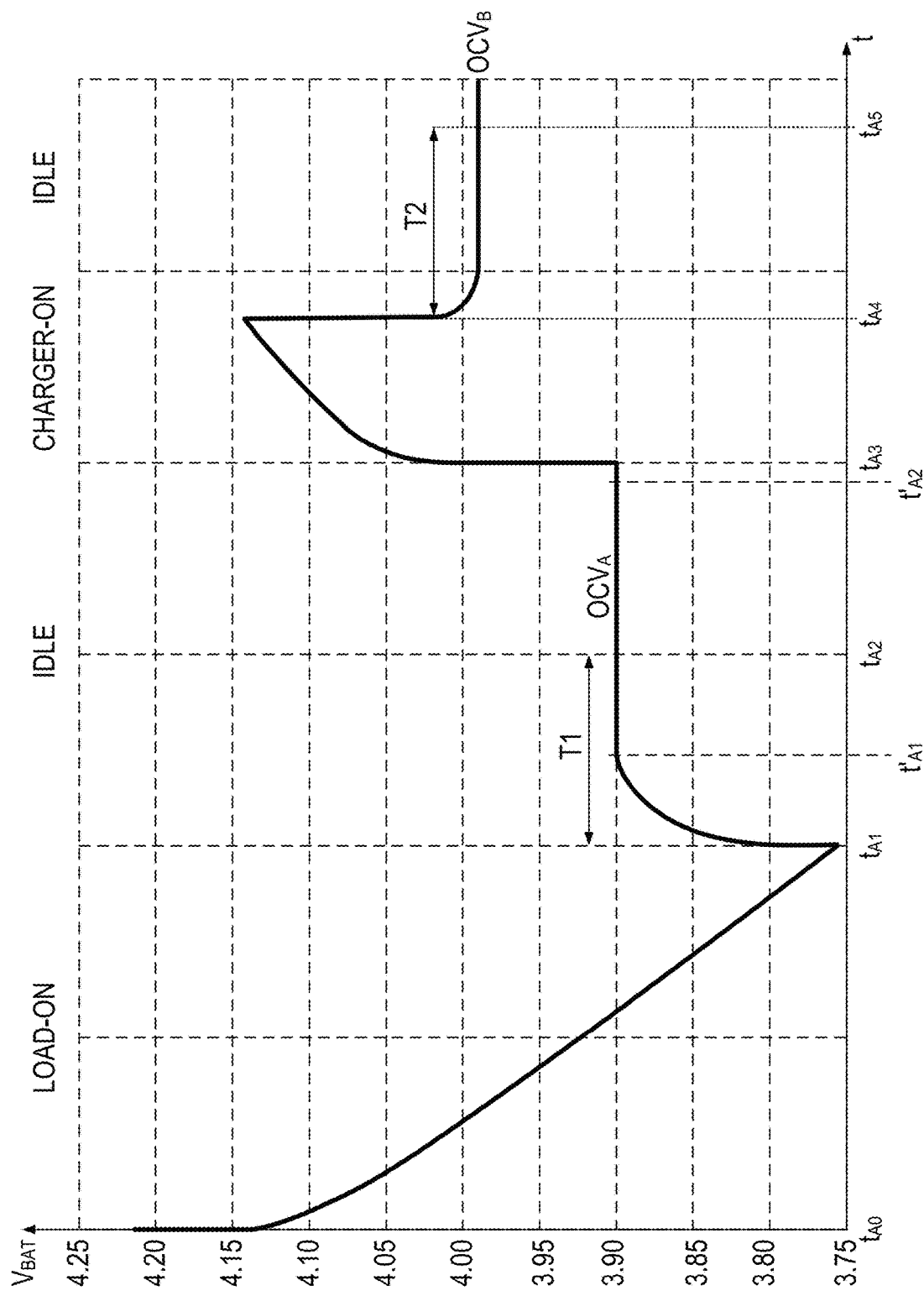
FIG. 3 illustrates an example of a plot of voltage of a battery under various states, in an embodiment of the present invention.

FIG. 3 illustrates an example of a plot for a voltage $V_{BAT}$ of the battery 210 in various states, in an embodiment of the present invention. FIG. 3 is described in combination with FIG. 2A and FIG. 2B to explain how to calculate a charging aging factor AFC of the battery 210. As shown in FIG. 3, the battery 210 transitions from a load-on state (or a discharging state) to an idle state at time tai, transitions from the idle state to a charging state at time $t_{A3}$, and transitions from the charging state to another idle state at time $t_{A4}$. The idle state from time tai to time $t_{A3}$ can be referred to as first idle state.

The idle state after time $t_{A4}$ can be referred to as second idle state. In an embodiment, when the battery 210 is neither charging nor discharging (or when the battery 210 has a discharge current, and the discharge current is so small that it can be ignored), the battery 210 is in an idle state. By way of example, if a portable device is powered off (or the portable device is not in use under an ultra power saving mode, an airplane mode, or the like), and the portable device is not being charged, then the battery in the portable device can be considered to be in an idle state.

In an embodiment, when the battery 210 transitions from a load-on state to an idle state, the battery voltage $V_{BAT}$ can increase until it reaches a stabilized open-circuit voltage. When the battery 210 transitions from a charging state to an idle state, the battery voltage $V_{BAT}$ can decrease until it reaches a stabilized open-circuit voltage. As shown in FIG. 3, after entering the first idle state, the open-circuit voltage of the battery 210 gradually stabilizes. When the open-circuit voltage has stabilized (e.g., from time $t'_{A1}$ to time $t_{A3}$), the processor 228 obtains, from the second ADC 236, a first open-circuit voltage $OCV_A$ of the battery 210 in the first idle state. In an embodiment, as used herein, an "open-circuit voltage has stabilized" means that a rate of change in the open-circuit voltage is relatively small, e.g., less than a preset reference, and the rate of change can be ignored. For example, if the processor 228 detects that the battery 210 enters the first idle state, the processor 228 can start a timer. When a predetermined time interval T1 expires, e.g., at time $t_{A2}$, the open-circuit voltage is considered to have stabilized, and the processor 228 obtains a first open-circuit voltage $OCV_A$ from the second ADC 236. For another example, the battery management controller 202 can include a register or a memory that records the battery voltage $V_{BAT}$ of the battery 210. If the processor 228 detects that the battery 210 transitions from the first idle state to a charging state, then the processor 228 can read, from the register or the memory, data for the latest open-circuit voltage $OCV_A$, e.g., corresponding to time $t'_{A2}$ shown in FIG. 3. After obtaining the first open-circuit voltage $OCV_A$, the processor 228 searches the abovementioned state-of-charge lookup table rSoC (OCV) for a first state of charge $rSoC_A$ that corresponds to the first open-circuit voltage $OCV_A$. For example, the processor 228 searches the multiple data groups in the lookup table rSoC (OCV) for a corresponding data group. The corresponding data group includes a voltage value that is most close to the first open-circuit voltage $OCV_A$, compared with the other voltage values stored in the lookup table rSoC (OCV). The value of the state of charge in the corresponding data group can be considered as the first state of charge $rSoC_A$ that corresponds to the first open-circuit voltage $OCV_A$. The first state of charge $rSoC_A$ can be considered to be an available state of charge of the battery 210 in the first idle state.

Similarly, as shown in FIG. 3, after entering the second idle state, the open-circuit voltage of the battery 210 gradually stabilizes. When the open-circuit voltage has stabilized, the processor 228 obtains, from the second ADC 236, a second open-circuit voltage $OCV_B$ of the battery 210 in the second idle state. For example, if the processor 228 detects that the battery 210 enters the second idle state, the processor 228 can start a timer. When a predetermined time interval T2 expires, e.g., at time $t_{A5}$, the open-circuit voltage is considered to have stabilized, and the processor 228 obtains a second open-circuit voltage $OCV_B$ from the second ADC 236. The durations of the time intervals T1 and T2 can be, but not necessarily, the same. After obtaining the second open-circuit voltage $OCV_B$, the processor 228 searches the state-of-charge lookup table rSoC (OCV) for a second state of charge $rSoC_B$ that corresponds to the second open-circuit voltage $OCV_B$. The second state of charge $rSoC_B$ can be considered to be an available state of charge of the battery 210 in the second idle state.

Additionally, as shown in FIG. 3, the battery 210 is in a continuous charging state between the first idle state and the second idle state (e.g., from time $t_{A3}$ to time $t_{A4}$). In an embodiment, a continuous charging state refers to a charging state in which a charge current of a battery is continuously greater than zero amperes. The processor 228 calculates the number of charges, e.g., referred to as charge amount $Q(t)_{CHG}$, flowing to the battery 210 in the continuous charging state, e.g., according to the abovementioned equation (1), and updates a current full absolute charge capacity FACC of the battery 210 according to a ratio of the charge amount $Q(t)_{CHG}$ to a difference between the second state of charge $rSoC_B$ and the first state of charge $rSoC_A$.

More specifically, in an embodiment, the processor 228 calculates a current charging aging factor AFC of the battery 210 according to the following equation:

$$AFC = \frac{Q(t)_{CHG}}{(rSoC_B - rSoC_A)}. \quad (5)$$

The processor 228 further updates a current full absolute charge capacity FACC of the battery 210 according to the following equation:

$$FACC = FACC_0 \times \frac{AFC}{AFC_0}. \quad (6)$$

In equation (6), FACC represents a current full absolute charge capacity of the battery 210, $FACC_0$ represents a previous full absolute charge capacity of the battery 210, and $AFC_0$ represents a previous charging aging factor of the battery 210. The previous charging aging factor $AFC_0$ refers to a charging aging factor that is obtained by the processor 228 after a previous charging process of the battery 210. In an embodiment, the previous full absolute charge capacity $FACC_0$ refers to a full absolute charge capacity that is previously updated. In another embodiment, if the battery 210 is a new battery, the previous full absolute charge capacity $FACC_0$ refers to the aforementioned predetermined full absolute charge capacity pFACC of the battery 210.

Figure 4:
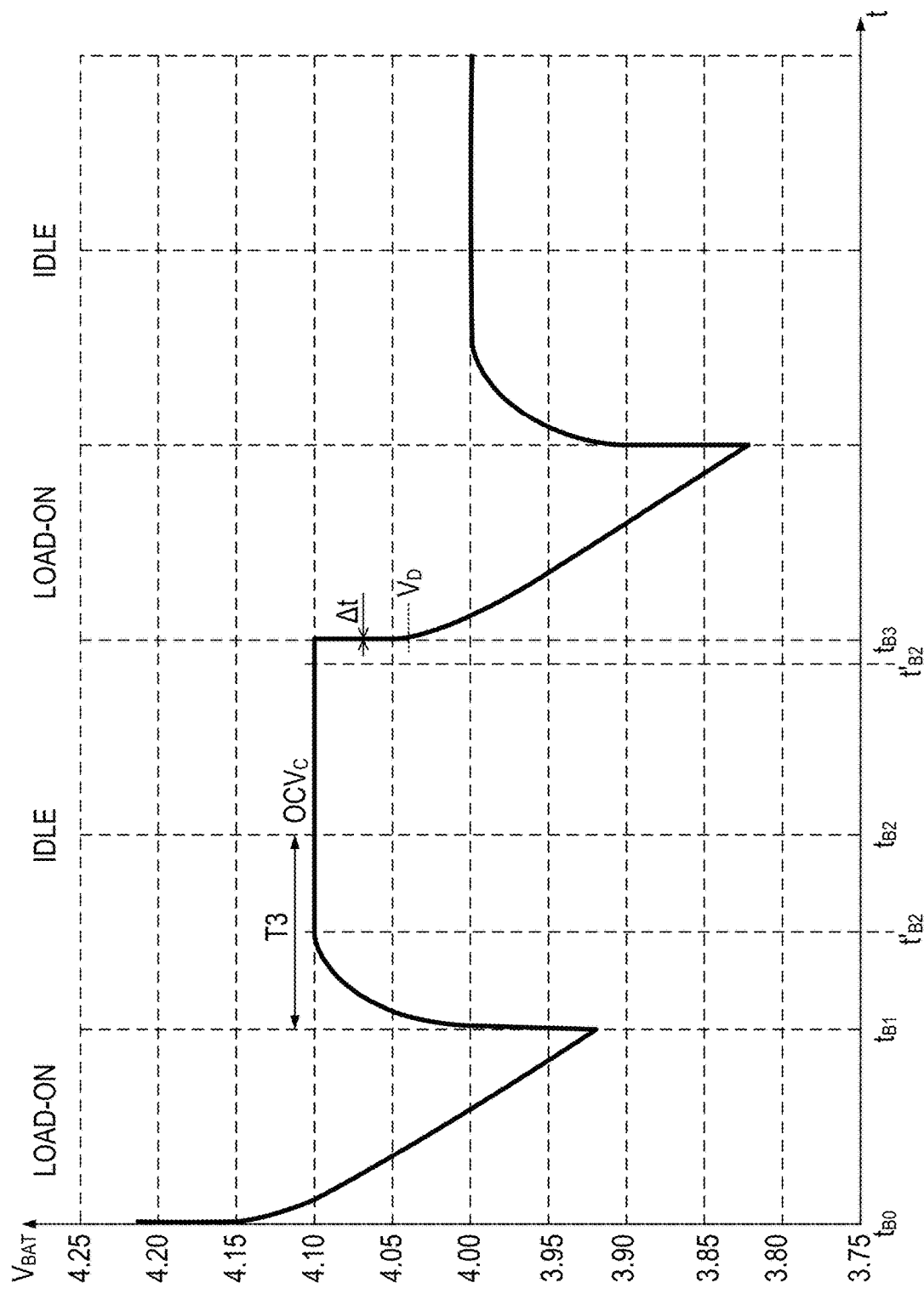
FIG. 4 illustrates an example of a plot of voltage of a battery under various states, in an embodiment of the present invention.

FIG. 4 illustrates an example of a plot of a voltage $V_{BAT}$ of the battery 210 in various states, in an embodiment of the present invention. FIG. 4 is described in combination with FIG. 2A and FIG. 2B to explain how to calculate a discharging aging factor AFD of the battery 210. As shown in FIG. 4, the battery 210 transitions from an idle state at time to a load-on state (or a discharging state) at time $t_{B3}$. The load-on state immediately follows the idle state.

In an embodiment, after entering the idle state, the open-circuit voltage of the battery 210 gradually stabilizes. When the open-circuit voltage of the battery 210 has stabilized (e.g., from time $t'_{B1}$ to time $t_{B3}$), the processor 228 obtains, from the second ADC 236, an open-circuit voltage $OCV_C$ of the battery 210 in the idle state. For example, if the processor 228 detects that the battery 210 enters the idle state, the processor 228 can start a timer. When a predetermined time interval T3 expires, e.g., at time $t_{B2}$, the open-circuit voltage is considered to have stabilized, and the processor 228 obtains an open-circuit voltage $OCV_C$ from the second ADC 236. For another example, when the processor 228 detects that the battery 210 transitions from the idle state to the load-on state, the processor 228 can read, from an above-mentioned register or memory that records the battery voltage $V_{BAT}$, data for the latest open-circuit voltage $OCV_C$, e.g., corresponding to time $t'_{B2}$ shown in FIG. 4.

When the battery 210 transitions from the idle state to the load-on state (e.g., at time $t_{B3}$), the battery voltage $V_{BAT}$ can rapidly drop from the open-circuit voltage $OCV_C$ to a discharge initial voltage VD. The processor 228 can obtain, from the second ADC 236, the discharge initial voltage VD and a discharge current $I_{DIS}$ of the battery 210 in the load-on state. More specifically, the processor 228 can receive, from the second ADC 236, a signal 214 indicative of the initial discharge voltage VD and a signal 216 indicative of the discharge current his. For example, the processor 228 can start a timer when it detects that the battery 210 transitions from an idle state to a load-on state, e.g., at time $t_{B3}$. When a preset time interval Δt (e.g., 3 milliseconds (ms), 4 ms, or the like) expires, the processor 228 obtains a battery voltage VD. That battery voltage VD can be considered to be an initial discharge voltage VD of the battery 210 in the load-on state. Additionally, the processor 228 obtains a discharge current his of the battery 210 from the second ADC 236. In an embodiment, the preset time interval Δt is greater than the time that is required for the battery voltage $V_{BAT}$ to drop from the open-circuit voltage $OCV_C$ to the initial discharge voltage VD, and the preset time interval Δt is relatively small (e.g., less than 5 ms) so that a difference between the actual initial discharge voltage VD and the initial discharge voltage VD is relatively small and can be ignored. For another example, the processor 228 (or other circuitry in the battery management system 200A or 200B) can detect a rate of change $dV_{BAT}/dt$ in the battery voltage $V_{BAT}$. At the moment when the battery 210 transitions from the idle state to the load-on state, the rate of change $dV_{BAT}/dt$ can be relatively large. When the battery voltage $V_{BAT}$ drops to the initial discharge voltage VD, the rate of change $dV_{BAT}/dt$ can decrease. When the processor 228 (or the other circuitry) detects that the rate of change $dV_{BAT}/dt$ is less than a preset threshold, the processor 228 can obtain a battery voltage VD at that moment, and that battery voltage VD can be considered to be an initial discharge voltage VD of the battery 210 in the load-on state.

In an embodiment, the processor 228 updates a current full absolute charge capacity FACC of the battery 210 according to the discharge current his and a difference between the discharge initial voltage VD and the open-circuit voltage $OCV_C$.

More specifically, the processor 228 calculates a current discharging aging factor AFD according to the following equation:

$$AFD = \frac{(V_D - OCV_C)}{I_{DIS}}. \tag{7}$$

The processor 228 further updates the current full absolute charge capacity FACC according to the following equation:

$$FACC = FACC_0 \times \frac{AFD}{AFD_0}. \tag{8}$$

In equation (8), FACC represents a current full absolute charge capacity of the battery 210, $FACC_0$ represents a previous full absolute charge capacity of the battery 210, and $AFD_0$ represents a previous discharging aging factor of the battery 210. The previous discharging aging factor $AFD_0$ refers to a discharging aging factor that is obtained by the processor 228 during or after a previous discharging process of the battery 210.

As mentioned above, in an embodiment, the processor 228 can update the full absolute charge capacity FACC of the battery 210 according to the charging aging factor AFC and equation (6). In another embodiment, the processor 228 can update the full absolute charge capacity FACC of the battery 210 according to the discharging aging factor AFD and equation (8). Additionally, in yet another embodiment, the processor 228 can update the full absolute charge capacity FACC according to the charging aging factor AFC and the discharging aging factor AFD based on a specific function, e.g., equation (9) as follows.

$$FACC = f(AFC, AFD, FACC_0) \tag{9}$$

For example, the processor 228 can update the current full absolute charge capacity FACC according to the following equation:

$$FACC = \alpha \times FACC_0 \times \frac{AFC}{AFC_0} + \beta \times FACC_0 \times \frac{AFD}{AFD_0}. \tag{10}$$

In equation (10), α and β are weighting factors less than 1, and the sum of α and β is equal to 1, e.g., α+β=1. Equation (10) is an example for explanation purposes, and is not intended to limit the invention.

Figure 5:
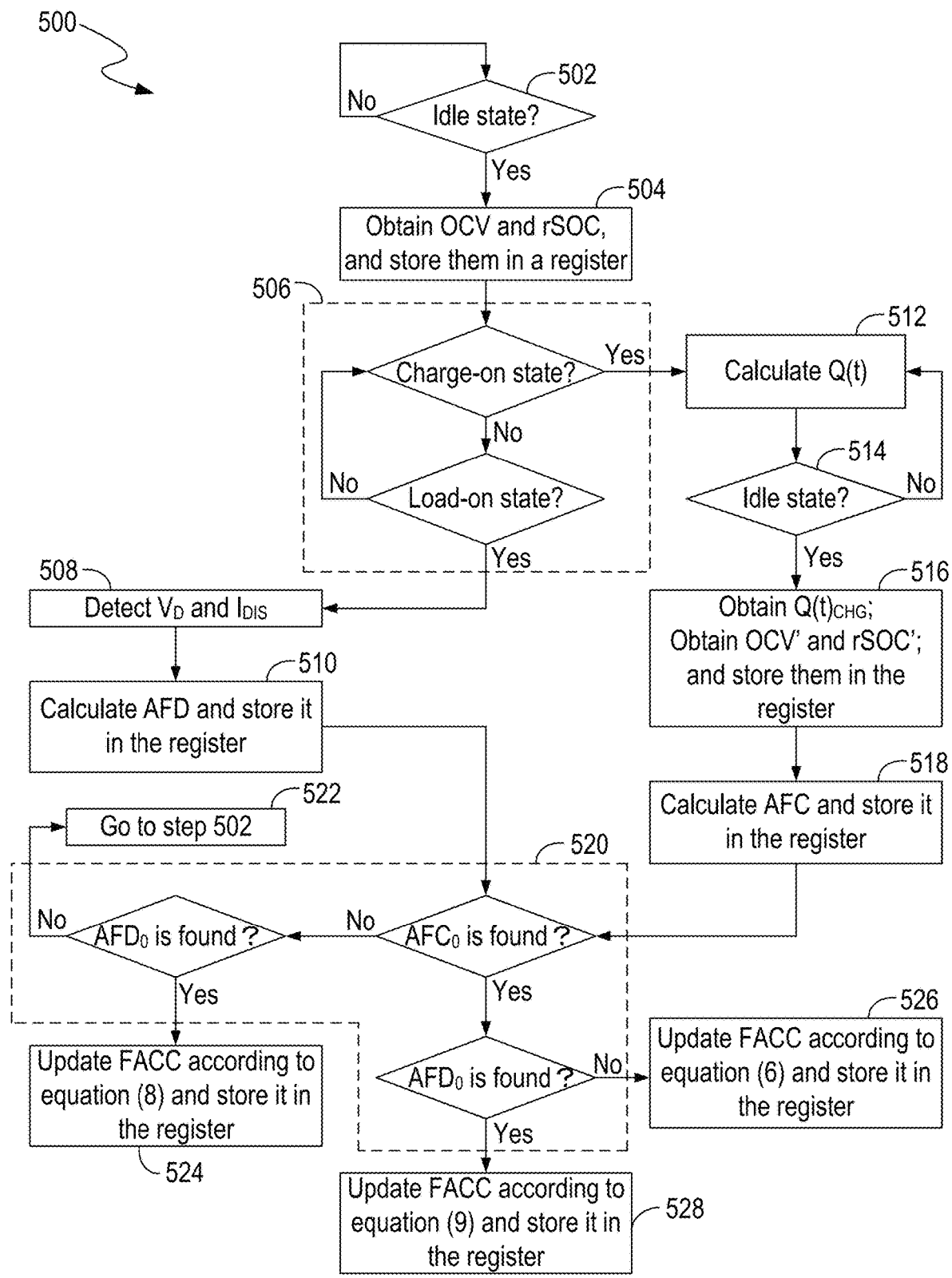
FIG. 5 illustrates an example of a method for updating a full-absolute-charge capacity of a battery, in an embodiment of the present invention.

FIG. 5 illustrates a flowchart 500 of an example of a method for updating a full absolute charge capacity FACC of the battery 210, in an embodiment of the present invention. Although specific steps are disclosed in FIG. 5, such steps are examples for illustrative purposes. That is, embodiments according to the present invention are well suited to performing various other steps or variations of the steps recited in FIG. 5. FIG. 5 is described in combination with FIG. 2A, FIG. 2B, FIG. 3, and FIG. 4.

As shown in FIG. 5, at step 502, the processor 228 detects whether the battery 210 enters an idle state. If the battery 210 enters an idle state, the flowchart 500 goes to step 504. At step 504, the processor 228 obtains an open-circuit voltage OCV of the battery 210 in the idle state, obtains a corresponding state of charge rSoC from the state-of-charge lookup table rSoC (OCV), and stores the open-circuit voltage OCV and the state of charge rSoC in a register.

At step 506, the processor 228 detects whether the battery 210 transitions from the idle state to a charging state or to a load-on state. If the battery 210 transitions from the idle state to a charging state, then the flowchart 500 goes to step 512. If the battery 210 transitions from the idle state to a load-on state, then the flowchart 500 goes to step 508.

At step 508, the processor 228 detects/obtains an initial discharge voltage VD and a discharge current his of the battery 210 in the load-on state. At step 510, the processor 228 calculates a discharging aging factor AFD according to the discharge initial voltage VD, the discharge current his, and the open-circuit voltage OCV obtained in step 504 based on equation (7), e.g., $AFD = (V_D - OCV)/I_{DIS}$, and stores the discharging aging factor AFD in the register.

At step 512, the processor 228 calculates the number of charges $Q(t)_{CHG}$ flowing through the battery 210 in the charging state. At step 514, if the processor 228 detects that the battery 210 transitions from the charging state to another idle state, then the flowchart 500 goes to step 516. At step 516, the processor 228 obtains the charge amount $Q(t)_{CHG}$ of the battery 210, obtains the open-circuit voltage OCV' and the state of charge rSoC' of the battery 210 in the current idle state, and stores the open-circuit voltage OCV' and the state of charge rSoC' in a register. At step 518, the processor 228 calculates a charging aging factor AFC according to the charge amount $Q(t)_{CHG}$ and the state of charge rSoC' obtained at step 516, and according to a previously stored state of charge rSoC (e.g., $AFC = Q(t)_{CHG}/(rSoC'-rSoC))$. The processor 228 further stores the calculated charging aging factor AFC in the register.

At step 520, the processor 228 searches the register to determine whether there is a previous charging aging factor $AFC_0$ and/or a previous discharging aging factor $AFD_0$ stored in the register.

If no previous charging aging factor $AFC_0$ nor previous discharging aging factor $AFD_0$ are found in the register, then the flowchart 500 goes to step 522 to repeat the flowchart 500.

If a previous discharging aging factor $AFD_0$ is found in the register, and no previous charging aging factor $AFC_0$ is found, then the flowchart 500 goes to step 524. At step 524, the processor 228 updates a current full absolute charge capacity FACC of the battery 210 according to equation (8), and stores the updated current full absolute charge capacity FACC in the register.

If a previous charging aging factor $AFC_0$ is found in the register, and no previous discharging aging factor $AFD_0$ is found, then the flowchart 500 goes to step 526. At step 526, the processor 228 updates a current full absolute charge capacity FACC of the battery 210 according to equation (6), and stores the updated current full absolute charge capacity FACC in the register.

If a previous charging aging factor $AFC_0$ and a previous discharging aging factor $AFD_0$ are found in the register, then the flowchart 500 goes to step 528. At step 528, the processor 228 updates a current full absolute charge capacity FACC of the battery 210 according to equation (9), and stores the updated current full absolute charge capacity FACC in the register.

Accordingly, an embodiment according to the present invention provides a method of updating a current full absolute charge capacity FACC of the battery 210 based on aging factors of the battery 210, thereby obtaining a more accurate current full available charge capacity DFC and a more accurate current available state of charge rSoC of the battery 210.

As mentioned above, in an embodiment, during a discharging process, the temperature of the battery 210 can increase when the discharge current his is relatively large. Thus, the processor 228 is configured to estimate an end-of-discharge temperature $T_{EOD}$ of the battery 210. In one such embodiment, the EOD remaining capacity $aRC_{EOD}$ of the battery 210 in equation (2c) is obtained by searching the lookup table aRC (V, I, T) for a remaining capacity that corresponds to an end-of-discharge voltage $V_{EOD}$, a current battery current $I_N$, and the end-of-discharge temperature $T_{EOD}$:

$$aRC_{EOD} = f(V_{EOD}, I_N, T_{EOD}) \quad (11)$$

Similarly, the EOD state of charge $aSoC_{EOD}$ of the battery 210 in equation (4a) is obtained by searching the lookup table aRC (V, I, T) for a state of charge that corresponds to an end-of-discharge voltage $V_{EOD}$, a current battery current $I_N$, and the end-of-discharge temperature $T_{EOD}$:

$$aSOC_{EOD} = f(V_{EOD}, I_N, T_{EOD}) \quad (12)$$

As a result, the processor 228 can obtain a more accurate full available charge capacity DFC as well as a more accurate available state of charge $rSoC_N$ of the battery 210.

In an embodiment, a method of determining an estimate of an end-of-discharge temperature $T_{EOD}$ of the battery 210 involves multiple parameters, e.g., including a total discharge time $\Delta t_{TOT}$, a discharge rate Rims, a discharged energy $E_{DIS}$, an equivalent heat capacity factor $K_N$, etc. More specifically, in an embodiment, a total discharge time $\Delta t_{TOT}$ of a battery includes an absolute total discharge time $\Delta t_{TOT\_A}$ and an available total discharge time $\Delta t_{TOT\_R}$. The absolute total discharge time $\Delta t_{TOT\_A}$ refers to the time for the battery to discharge from a fully charged state to a fully discharged state. The available total discharge time $\Delta t_{TOT\_R}$ refers to the time for the battery to discharge from a fully charged state to an end-of-discharge state. The available total discharge time $\Delta t_{TOT\_R}$ is less than the absolute total discharge time $\Delta t_{TOT}$ A.

In an embodiment, when a battery is discharged, parameters that reflect a situation of discharging of the battery include a discharge current $I_{DIS}$ and a discharge rate $RI_{DIS}$. The discharge rate $RI_{DIS}$ can be referred to as "C-rate." A C-rate is a measure of the rate at which a battery is discharged relative to its maximum capacity (e.g., a full absolute charge capacity FACC). A 1 C rate means that the discharge current $I_{DIS}$ will discharge the entire battery in 1 hour. A 2 C rate means that the discharge current will discharge the entire battery in 30 minutes. In other words, if the discharge rate $RI_{DIS}$ is 1 C, then the absolute total discharge time $\Delta t_{TOT}$ A of the battery is 1 hour. Similarly, if the discharge rate $RI_{DIS}$ is 2 C, then the absolute total discharge time $\Delta t_{TOT}$ A of the battery is 30 minutes. In an embodiment, the discharge rate $RI_{DIS}$ can be obtained by a calculation based on the discharge current $I_{DIS}$ and the full absolute charge capacity FACC, e.g., $RI_{DIS} = I_{DIS} \times (1 \text{ hour}/FACC)$. In another embodiment, the discharge rate Rims can be obtained by reading information in an instruction provided by a user. For example, a high power machine such as a portable vacuum can have a few power levels for a user to select. The power levels may include a lower power level corresponding to a 1C rate of discharge, a medium power level corresponding to a 2C rate of discharge, and a higher power level corresponding to a 4C rate of discharge. Thus, the current discharge rate $RI_{DIS}$ can be obtained by reading the instruction information for the power level that is selected by the user.

In an embodiment, a discharged energy $E_{DIS}$ refers to the amount of energy released from a battery because of being discharged. The discharged energy Ems can be given by:

$$E_{DIS} = \int_{t1}^{t2} P_{DIS} dt. \quad (13a)$$

In equation (13a), $P_{DIS}$ represents a discharge power of the battery. In an embodiment, if the discharge current $I_{DIS}$ of the battery is relatively stable, then the discharge power can be given by: $P_{DIS} = I_{DIS} \times V_{NOM}$, where $V_{NOM}$ represents a nominal voltage of the battery. Thus, equation (13a) can be simplified as follows:

$$E_{DIS} = I_{DIS} \times V_{NOM} \times \Delta t_{DIS}. \quad (13b)$$

In equation (13b), $\Delta t_{DIS}$ represents a discharge time of the battery, e.g., $\Delta t_{DIS} = t2 - t1$.

In an embodiment, the amount of change $\Delta T$, e.g., increment, of a battery's temperature can be determined by a discharged energy Ems and an equivalent heat capacity factor $K_N$ of the battery. More specifically, the temperature change $\Delta T$, e.g., increment, in the battery's temperature can be given by:

$$\Delta T = K_N \times E_N. \quad (14)$$

Additionally, in an embodiment, the equivalent heat capacity factor $K_N$ of the battery has a specific relationship with the discharge current $I_{DIS}$ of the battery, and can be given by a function as follows:

$$K_N = f(I_{DIS}). \quad (15)$$

In an embodiment, the function (15) can be obtained based on experimental data.

FIG. 6A, FIG. 6B, FIG. 6C, and FIG. 6D illustrate examples of plots of temperature changes in different situations based on examples of experimental data, in embodiments of the present invention. Taking FIG. 6A for example, line 642 shows the change in the battery's temperature in a situation in which a fully charged battery discharges at a discharge rate of 0.8 C (e.g., $RI_{DIS}$=0.8 C) and the battery's initial temperature is 5° C.; and line 644 shows the change in the battery's temperature in a situation in which the fully charged battery discharges at a discharge rate of 0.8 C and the battery's initial temperature is 25° C. Taking FIG. 6B for another example, line 646 shows the change in the battery's temperature in a situation in which the fully charged battery discharges at a discharge rate of 1.2 C and the battery's initial temperature is 15° C. In an embodiment, a discharge time database $\Delta t$ ($RI_{DIS}$, $T_{INITIAL}$) can be established based on experimental data at various discharge rates, e.g., 0.4 C, 0.8 C, ..., 4 C, etc., and at different initial temperatures, e.g., 5° C., 10° C., ..., 45° C., etc. The discharge time database $\Delta t$ ($RI_{DIS}$, $T_{INITIAL}$) can also be referred to as a cell temperature adjustment table. The discharge time database $\Delta t$ ($RI_{DIS}$, $T_{INITIAL}$) can be stored in a memory, e.g., the memory 830 shown in FIG. 8.

More specifically, in an embodiment, the discharge time database $\Delta t$ ($RI_{DIS}$, $T_{INITIAL}$) includes multiple sets of data. Each set of data corresponds to a discharge rate $RI_{DIS}$ and an initial temperature $T_{INITIAL}$. For example, as shown in FIG. 6A, line 642 represents a set of data corresponding to a discharge rate of 0.8 C and an initial temperature of 5° C., and line 644 represents a set of data corresponding to a discharge rate of 0.8 C and an initial temperature of 25° C. For another example, as shown in FIG. 6B, line 646 represents a set of data corresponding to a discharge rate of 1.2 C and an initial temperature of 15° C. Thus, each set of data includes information for a discharge rate and an initial temperature. Additionally, each set of data includes information for an available total discharge time $\Delta t_{TOT\_R}$. For example, as shown in FIG. 6A, if the battery is discharged at 0.8 C rate, and the battery's initial temperature is 5° C., then the available total discharge time $\Delta t_{TOT\_R}$ of the battery can be 3843 seconds. For another example, as shown in FIG. 6B, if the battery is discharged at 1.2 C rate and the battery's initial temperature is 15° C., then the available total discharge time $\Delta t_{TOT\_R}$ of the battery can be 2719 seconds. Moreover, each set of data can, but not necessarily, include voltage values of the battery's voltage, and coulomb values of the charges discharged from the battery at different time points (e.g., from the time point when the battery starts to discharge to the time point when the battery enters the end-of-discharge state).

In an embodiment, the battery 210 is fully charged when the battery 210 starts to discharge. In one such embodiment, the processor 228 can obtain a current battery discharge rate $RI_{DIS}$ and a current battery temperature $T_N$, and search the discharge time database $\Delta t$ ($RI_{DIS}$, $T_{INITIAL}$) for an available total discharge time $\Delta t_{TOT\_R}$ that corresponds to the current battery discharge rate $RI_{DIS}$ and the current battery temperature $T_N$, e.g., $\Delta t_{TOT\_R}$=f($RI_{DIS}$, $T_N$). The processor 228 can estimate the amount of energy, e.g., a discharged energy Ems, that will be released from the battery 210 when the battery 210 discharges from the fully charged state to the end-of-discharge state, according to the available total discharge time $\Delta t_{TOT\_R}$ and equation (13a), e.g., $E_{DIS}=I_{DIS} \times V_{NOM} \times \Delta t_{TOT\_R}$. The processor 228 can also obtain an equivalent heat capacity factor $K_N$ of the battery 210 based on equation (15), e.g., $K_N=f(I_{DIS})$, and estimate a temperature change $\Delta T_{EOD}$ of the battery 210 based on equation (14), e.g., $\Delta T_{EOD}=K_N \times E_{DIS}$. As a result, the processor 228 can estimate an end-of-discharge temperature $T_{EOD}$ of the battery 210 by adding the temperature change $\Delta T_{EOD}$ to the current battery temperature $T_N$, e.g., $T_{EOD}=T_N+\Delta T_{EOD}$.

In another embodiment, the battery 210 is not fully charged when the battery 210 starts to discharge. In one such embodiment, an example of a method of determining an estimate of an end-of-discharge temperature $T_{EOD}$ of the battery 210 is described in combination with FIG. 7, FIG. 8, and FIG. 9A.

In the example of FIG. 7, dot 740 is assumed to represent a situation in which the battery 210 starts to discharge. More specifically, the battery 210 starts to discharge at time point t1, at a current discharge rate of Rh's, and at a current temperature of $T_N$. Assuming that the battery 210 is being discharged at the discharge rate $RI_{DIS}$ for a while before the current time point t1, then the parameter $\Delta t_{PAST}$ shown in FIG. 7 represents an assumed time that passed from an assumed initial time point t0 when the battery 210 is fully charged and starts to discharge at the discharge rate $RI_{DIS}$ to the current time point t1. The processor 228 can estimate the assumed time $\Delta t_{PAST}$ according to a current absolute state of charge $aSoC_N$ and the current discharge rate $RI_{DIS}$. Based on the assumed time $\Delta t_{PAST}$, the processor 228 can estimate an assumed initial temperature $T_{INITIAL}$ of the battery 210 at the assumed initial time point to. Accordingly, the processor 228 can search the discharge time database $\Delta t$ $T_{INITIAL}$) for an assumed available total discharge time $\Delta t_{TOT\_R}$ that corresponds to the current discharge rate $RI_{DIS}$ and the assumed initial temperature $T_{INITIAL}$, thereby determining an estimate of an end-of-discharge temperature $T_{EOD}$ of the battery 210 according to the assumed available total discharge time $\Delta t_{TOT\_R}$.

FIG. 8 illustrates a block diagram of an example of a battery management system 800, in an embodiment of the present invention. FIG. 8 is described in combination with FIG. 2A, FIG. 2B, FIG. 3, FIG. 4, FIG. 5, FIG. 6A, FIG. 6B, FIG. 6C, FIG. 6D, and FIG. 7. In the example of FIG. 8, the battery management controller 802 is similar to the battery management controller 202 in FIG. 2A or FIG. 2B except that the battery management controller 802 further includes an abovementioned discharge time database $\Delta t$ ($RI_{DIS}$, $T_{INITIAL}$) stored in a memory, e.g., the memory 830 shown in FIG. 8. The processor 228 can estimate an end-of-discharge temperature $T_{EOD}$ of the battery 210 based on the database $\Delta t$ ($RI_{DIS}$, $T_{INITIAL}$).

FIG. 9A illustrates a flowchart 900A of an example of a method of determining an estimate of an end-of-discharge temperature $T_{EOD}$ of the battery 210, in an embodiment of the present invention. Although specific steps are disclosed in FIG. 9A, such steps are examples for illustrative purposes. That is, embodiments according to the present invention are well suited to performing various other steps or variations of the steps recited in FIG. 9A. FIG. 9A is described in combination with FIG. 2A, FIG. 2B, FIG. 3, FIG. 4, FIG. 5, FIG. 6A, FIG. 6B, FIG. 6C, FIG. 6D, FIG. 7, and FIG. 8.

As shown in FIG. 9, at step 902, the processor 228 obtains a current absolute state of charge $aSoC_N$ and a current discharge rate $RI_{DIS}$. As mentioned above, in an embodiment, the processor 228 can obtain the current absolute state of charge $aSoC_N$ by searching the lookup table aRC (V, I, T) for a state of charge that corresponds to a current battery voltage $V_N$, a current battery current $I_N$, and a current battery temperature $T_N$ of the battery 210. In an embodiment, the processor 228 can obtain the current discharge rate $RI_{DIS}$ by reading information in an instruction provided by a user, or by doing a calculation based on a current discharge current of the battery 210.

At step 904, the processor 228 determines an estimate of an assumed time $\Delta t_{PAST}$ according to the current absolute state of charge $aSoC_N$ and the current discharge rate $RI_{DIS}$. For example, the assumed time $\Delta t_{PAST}$ can be given by: $\Delta t_{PAST}=(100\%-aSoC_N)/RI_{DIS}$. As mentioned above, in an embodiment, the time $\Delta t_{PAST}$ represents an assumed time that has passed from an assumed initial time point t0 when the battery 210 is fully charged and starts to discharge at the discharge rate $RI_{DIS}$ to a current time point t1.

At step 906, the processor 228 determines an estimate of an assumed discharged energy $E_{PAST}$ according to the assumed time $\Delta t_{PAST}$, a current discharge current $I_{DIS}$ of the battery 210, and a nominal voltage $V_{NOM}$ of the battery 210. The assumed discharged energy $E_{PAST}$ refers to an amount of energy that is assumed to be released from the battery 210 during the assumed time $\Delta t_{PAST}$. Based on equation (13b), the assumed discharged energy $E_{PAST}$ can be given by: $E_{PAST}=I_{DIS}\times V_{NOM}\times \Delta t_{PAST}$.

At step 908, the processor 228 obtains an equivalent heat capacity factor $K_N$ of the battery 210 according to the discharge current $I_{DIS}$ based on equation (15).

At step 910, the processor 228 determines an estimate of an assumed temperature change $\Delta T_{CHANGE}$ of the battery 210 according to the equivalent heat capacity factor $K_N$ and the assumed discharged energy $E_{PAST}$. The assumed temperature change $\Delta T_{CHANGE}$ refers to the change in the battery temperature from the assumed initial time point t0 to the current time point t1. Based on equation (14), the assumed temperature change $\Delta T_{CHANGE}$ can be given by: $\Delta T_{CHANGE}=K_N\times E_{PAST}$.

At step 912, the processor 228 determines an estimate of an assumed initial temperature $T_{INITIAL}$ of the battery 210 at the assumed initial time point t0 according to a current battery temperature $T_N$ of the battery 210 and the assumed temperature change $\Delta T_{CHANGE}$, e.g., $T_{INITIAL}=T_N-\Delta T_{CHANGE}$.

At step 914, the processor 228 searches the discharge time database $\Delta t$ ($RI_{DIS}$, $T_{INITIAL}$) for an assumed available total discharge time $\Delta t_{TOT\_R}$ that corresponds to the current discharge rate $RI_{DIS}$ and the assumed initial temperature $T_{INITIAL}$, e.g., $\Delta t_{TOT\_R}=f(RI_{DIS}, T_{INITIAL})$. For example, the processor 228 can search the multiple sets of data in the discharge time database $\Delta t$ $T_{INITIAL}$) for a corresponding set of data. The corresponding set of data includes a discharge rate and an initial temperature that match the current discharge rate $RI_{DIS}$ and the assumed initial temperature $T_{INITIAL}$. If the corresponding set of data is found, then the available total discharge time in the corresponding set of data can be considered as the assumed available total discharge time $\Delta t_{TOT\_R}$. If the corresponding set of data is found, then the processor 228 can perform linear interpolation to estimate the available total discharge time $\Delta t_{TOT\_R}$ based on the data in the discharge time database $\Delta t$ ($RI_{DIS}$, $T_{INITIAL}$).

At step 916, the processor 228 determines an estimate of a total discharged energy Ems according to the assumed available total discharge time $\Delta t_{TOT\_R}$, the current discharge current his, and the nominal voltage $V_{NOM}$. The total discharged energy $E_{DIS}$ refers to the total amount of energy released from the battery 210 during the assumed available total discharge time $\Delta t_{TOT\_R}$. Based on equation (13b), the total discharged energy $E_{DIS}$ can be given by: $E_{DIS}=I_{DIS}\times V_{NOM}\times \Delta t_{TOT\_R}$.

At step 918, the processor 228 determines an estimate of a total temperature change $\Delta T_{EOD}$ according to the equivalent heat capacity factor $K_N$ and the total discharged energy $E_{DIS}$. The total temperature change $\Delta T_{EOD}$ refers to the change in the battery 210 from the assumed initial time point t0 to the end-of-discharge time point $t_{END}$ when the battery 210 enters an end-of-discharge state. Based on equation (14), the total temperature change $\Delta T_{EOD}$ can be given by: $\Delta T_{EOD}=K_N\times E_{DIS}$.

At step 920, the processor 228 determines an estimate of an end-of-discharge temperature $T_{EOD}$ of the battery 210 according to the total temperature change $\Delta T_{EOD}$ and the assumed initial temperature $T_{INITIAL}$, e.g., $T_{EOD}=T_{INITIAL}+\Delta T_{EOD}$.

Figure 9B:
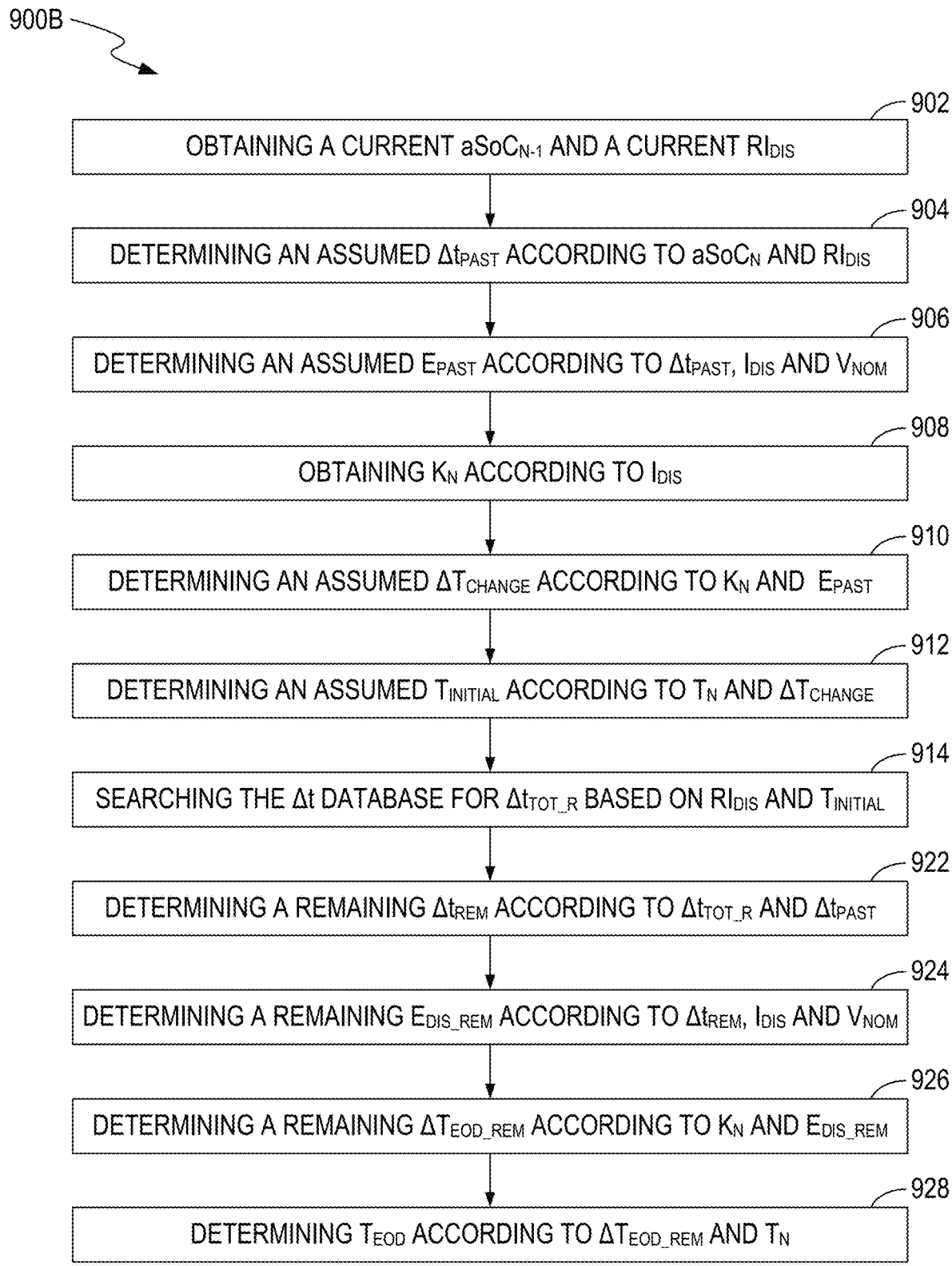
FIG. 9B illustrates a method of determining an estimate of an end-of-discharge temperature of a battery, in an embodiment of the present invention.

FIG. 9B illustrates a flowchart 900B of another example of a method of determining an estimate of an end-of-discharge temperature $T_{EOD}$ of the battery 210, in an embodiment of the present invention. Although specific steps are disclosed in FIG. 9B, such steps are examples for illustrative purposes. That is, embodiments according to the present invention are well suited to performing various other steps or variations of the steps recited in FIG. 9A. FIG. 9B is described in combination with FIG. 2A, FIG. 2B, FIG. 3, FIG. 4, FIG. 5, FIG. 6A, FIG. 6B, FIG. 6C, FIG. 6D, FIG. 7, FIG. 8, and FIG. 9A. As shown in FIG. 9B, the flowchart 900B is similar to the flowchart 900A in FIG. 9A except that the steps 916, 918, and 920 in FIG. 9A are replaced by the steps 922, 924, 926, and 928 in FIG. 9B.

More specifically, in the example of FIG. 9B, the flowchart 900B goes to step 922 following step 914. At step 922, the processor 228 determines an estimate of a remaining time $\Delta t_{REM}$ according to the assumed available total discharge time $\Delta t_{TOT\_R}$ and the assumed time $\Delta t_{PAST}$, e.g., $\Delta t_{REM}=\Delta t_{TOT\_R}-\Delta t_{PAST}$. The remaining time $\Delta t_{REM}$ refers an estimated time for the battery 210 to discharge from the current time point t1 to the end-of-discharge time point $t_{END}$ when the battery 210 enters an end-of-discharge state.

At step 924, the processor 228 determines an estimate of a remaining discharged energy $E_{DIS\_REM}$ according to the remaining time $\Delta t_{REM}$, the current discharge current $I_{DIS}$, and the nominal voltage $V_{NOM}$ of the battery 210. The remaining discharged energy $E_{DIS\_REM}$ refers to an estimated amount of energy that will be released from the battery 210 during the remaining time $\Delta t_{REM}$. Based on equation (13b), the remaining discharged energy $E_{DIS\_REM}$ can be given by: $E_{DIS\_REM}=I_{DIS}\times V_{NOM}\times \Delta t_{REM}$.

At step 926, the processor 228 determines an estimate of a remaining temperature change $\Delta T_{EOD\_REM}$ according to the equivalent heat capacity factor $K_N$ and the remaining discharged energy $E_{DIS\_REM}$. The remaining temperature change $\Delta T_{EOD\_REM}$ refers to the change in the battery 210 from the current time point t1 to the end-of-discharge time point $t_{END}$ when the battery 210 enters an end-of-discharge state. Based on equation (14), the remaining temperature change $\Delta T_{EOD\_REM}$ can be given by: $\Delta T_{EOD\_REM} = K_N \times E_{DIS\_REM}$.

At step 928, the processor 228 determines an estimate of an end-of-discharge temperature $T_{EOD}$ of the battery 210 according to the remaining temperature change $\Delta T_{EOD\_REM}$ and the current temperature $T_N$, e.g., $T_{EOD} = T_N \pm \Delta T_{EOD}$ REM.

Accordingly, in an embodiment, the processor 228 can estimate an assumed initial temperature $T_{INITIAL}$ of the battery 210 based on a current absolute state of charge $aSoC_N$ of the battery 210 and a current discharge rate $RI_{DIS}$ of the battery 210. Additionally, the processor 228 can search the discharge time database $\Delta t$ ($RI_{DIS}$, $T_{INITIAL}$) for an assumed available total discharge time $\Delta t_{TOT\_R}$ that corresponds to the current discharge rate $RI_{DIS}$ and the assumed initial temperature $T_{INITIAL}$. Moreover, the processor 228 can estimate an end-of-discharge temperature $T_{EOD}$ of the battery 210 according to the assumed available total discharge time $\Delta t_{TOT\_R}$.

Figure 10:
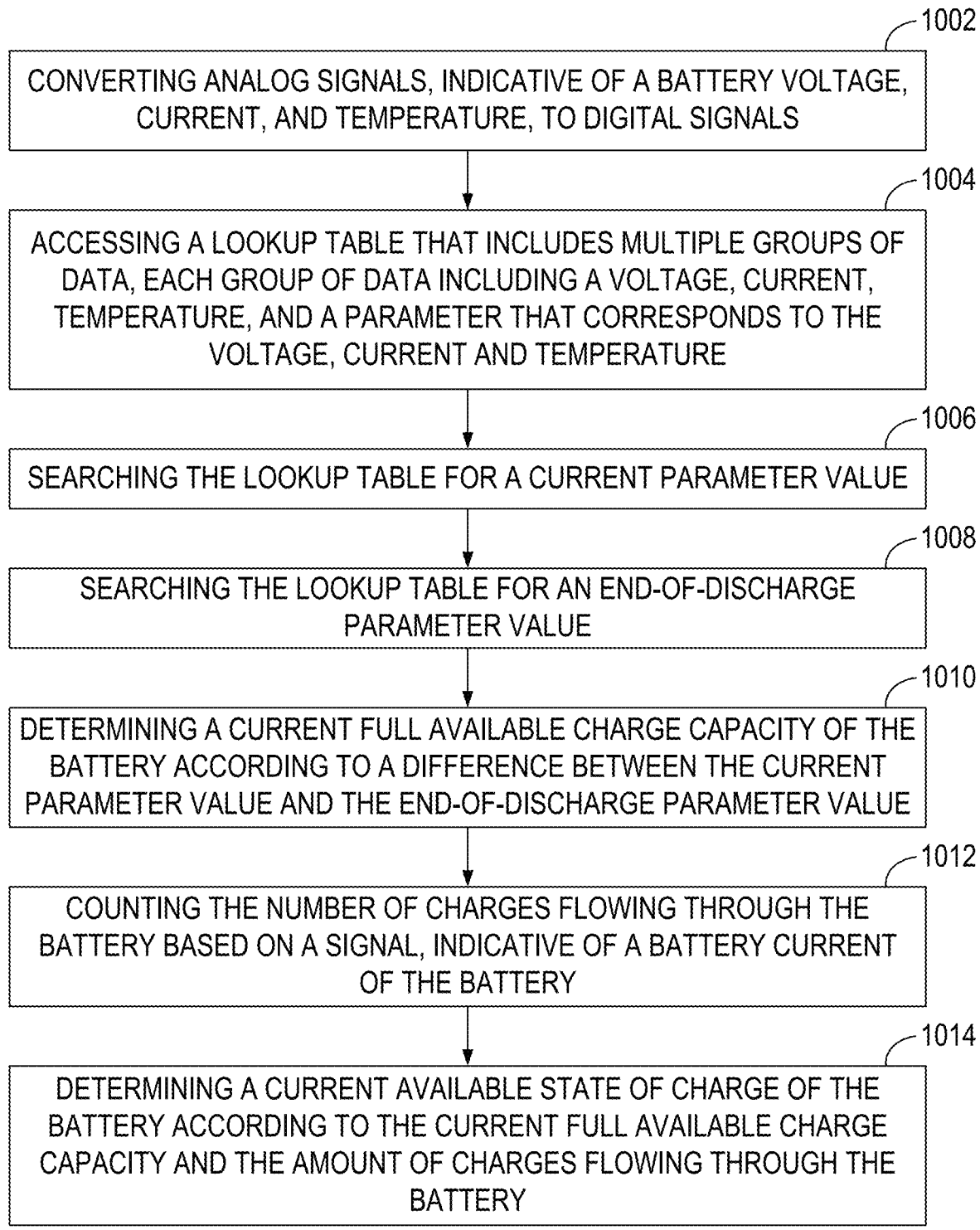
FIG. 10 illustrates an example of a method for determining an estimate of an available state of charge of a battery, in an embodiment of the present invention.

FIG. 10 illustrates an example of a method for determining an estimate of an available state of charge of a battery, in an embodiment of the present invention. Although specific steps are disclosed in FIG. 10, such steps are examples for illustrative purposes. That is, embodiments according to the present invention are well suited to performing various other steps or variations of the steps recited in FIG. 10. FIG. 10 is described in combination with FIG. 2A, FIG. 2B, FIG. 3, FIG. 4, FIG. 5, FIG. 6A, FIG. 6B, FIG. 6C, FIG. 6D, FIG. 7, FIG. 8, FIG. 9A, and FIG. 9B.

At step 1002, the analog-to-digital conversion circuitry 220 converts analog signals 214, 216, and 222, indicative of a current battery voltage $V_N$, a current battery current $I_N$, and a current battery temperature $T_N$ of the battery 210, to computer-readable digital signals 234.

At step 1004, the processor 228 accesses the remaining-capacity lookup table aRC (V, I, T) stored in the memory 230. The remaining-capacity lookup table aRC (V, I, T) includes multiple groups of data. Each group includes data for a voltage V, a current I, a temperature T, and a parameter associated with a remaining capacity aRC that corresponds to the voltage V, current I, and temperature T. The parameter can include an absolute remaining capacity aRC and/or an absolute state of charge aSoC (e.g., aSoC=aRC/pFACC).

More specifically, at step 1006, the processor 228 searches the remaining-capacity lookup table aRC (V, I, T) for a current parameter value, e.g., a current absolute remaining capacity $aRC_N$ or a current absolute state of charge aSoC of the battery 210, that corresponds to a current battery voltage $V_N$, a current battery current $I_N$, and a current battery temperature $T_N$ according the digital signals 234, e.g., $aRC_N = f(V_N, I_N, T_N)$.

At step 1008, the processor 228 searches the remaining-capacity lookup table aRC (V, I, T) for an end-of-discharge parameter value, e.g., an EOD remaining capacity $aRC_{EOD}$ or an EOD state of charge $aSoC_{EOD}$, that corresponds to an end-of-discharge voltage $V_{EOD}$, the current battery current $I_N$, and an end-of-discharge temperature $T_{EOD}$.

At step 1010, the processor 228 determines an estimate of a current full available charge capacity DFC of the battery 210 according to a difference between the current parameter value (e.g., $aRC_N$ or aSoC) and the end-of-discharge parameter value (e.g., $aRC_{EOD}$ or $aSoC_{EOD}$). Examples are provided in the descriptions related to the abovementioned equations (2c) and (4a).

At step 1012, the processor 228 counts the number of charges Q(t) based on a signal (e.g., the signal 232A in FIG. 2A or the signal 232B in FIG. 2B), indicative of a battery current of the battery 210, received from the analog-to-digital conversion circuitry 220.

At step 1014, the processor 228 determines an estimate of a current available state of charge $rSoC_N$ of the battery 210 according to the full available charge capacity DFC and the number of charges Q(t) flowing through the battery 210.

In summary, embodiments according to the present invention provide battery management controllers to estimate a current available state of charge $rSOC_N$ of a battery. The controller can count the number of charges Q(t) flowing through the battery based on coulomb counting. The controller can also estimate a current full available charge capacity DFC of the battery based on parameter values obtained from a remaining-capacity lookup table. The controller can further estimate the current available state of charge $rSOC_N$ of the battery according to the number of charges Q(t) and the current full available charge capacity DFC. In other words, the current available state of charge $rSOC_N$ of the battery can be obtained by combining the coulomb counting with the remaining-capacity lookup table. As a result, the abrupt change in the estimated value of the available state of charge that exists in the prior art can be eliminated in an embodiment of the present invention. Moreover, the controller can estimate aging factors, e.g., including a charging aging factor AFC and a discharging aging factor AFD, of the battery, and update a full absolute charge capacity FACC of the battery based on the aging factors, such that the estimation of the available state of charge $rSOC_N$ of the battery can be more accurate. Furthermore, the controller can estimate an end-of-discharge temperature $T_{EOD}$ of the battery based on a discharge time database, a discharge rate $RI_{DIS}$ of the battery, and a current temperature $T_N$ of the battery, thereby obtaining a more accurate current full available charge capacity DFC. As a result, the accuracy of the estimation of the available state of charge $rSOC_N$ of the battery can be further improved.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

We claim:

1. A battery management controller comprising:
a first analog-to-digital converter configured to integrate an analog signal, indicative of a measured battery current of a battery, to generate a digital signal indicative of an integral value of said measured battery current;
a second analog-to-digital converter configured to convert analog signals, indicative of a measured battery voltage, said measured battery current, and a measured battery temperature of said battery, to digital signals;
a memory configured to store a remaining-capacity lookup table that comprises a plurality of groups of data, wherein each group of said groups of data includes a voltage, a current, a temperature, and a parameter associated with a remaining capacity that corresponds to said voltage, said current, and said temperature; and a processor, coupled to said first analog-to-digital converter, said second analog-to-digital converter, and said memory, and configured to receive said digital signal from said first analog-to-digital converter, receive said digital signals from said second analog-to-digital converter, read data in said remaining-capacity lookup table, and determine an available state of charge of said battery based on said integral value, said measured battery voltage, said measured battery current, said measured temperature, and said remaining-capacity lookup table, wherein said processor determines said available state of charge by:

obtaining the number of charges flowing through said battery based on said integral value;

searching said remaining-capacity lookup table for a corresponding parameter value corresponding to said measured battery voltage, said measured battery current, and said measured battery temperature according to said digital signals;

searching said remaining-capacity lookup table for an end-of-discharge parameter value corresponding to an end-of-discharge voltage, said measured battery current, and an end-of-discharge temperature, wherein said end-of-discharge voltage is indicative for entering an end-of-discharge state to stop said battery from discharging and wherein said end-of-discharge temperature corresponds to a temperature of said battery when said end-of-discharge state is entered;

determining a full available charge capacity of said battery according to a difference between said corresponding parameter value and said end-of-discharge parameter value, wherein said full available charge capacity indicates the number of charges that are discharged from said battery from a time when said battery is fully charged to a time when said battery enters said end-of-discharge state; and determining said available state of charge of said battery according to said full available charge capacity and said number of charges obtained based on said integral value, wherein said battery management controller is coupled to a display screen that displays said available state of charge.

2. The battery management controller of claim 1, wherein said parameter comprises a state of charge, said corresponding parameter value comprises an absolute state of charge of said battery, and said end-of-discharge parameter value comprises an end-of-discharge state of charge of said battery, and wherein said processor is configured to determine said full available charge capacity based on the following equation:

$$DFC = FACC \times (aSOC_N - aSOC_{EOD}) / rSOC_{N-1},$$

where DFC represents a value of said full available charge capacity, FACC represents a value of a full absolute charge capacity of said battery, $aSOC_N$ represents a value of said absolute state of charge, $aSOC_{EOD}$ represents a value of said end-of-discharge state of charge, and $rSOC_{N-1}$ represents a value of a previously determined available state of charge of said battery.

3. The battery management controller of claim 2, wherein said processor is configured to determine said available state of charge based on the following equation:

$$rSOC_N = [(DFC \times rSOC_{N-1}) + Q(t)] / DFC,$$

where $rSOC_N$ represents a value of said available state of charge, and Q(t) represents a value of said number of charges obtained based on said integral value.

4. The battery management controller of claim 1, wherein said parameter comprises a remaining capacity, said corresponding parameter value comprises an absolute remaining capacity of said battery, and said end-of-discharge parameter value comprises an end-of-discharge remaining capacity of said battery, and wherein said processor is configured to determine said full available charge capacity based on the following equation:

$$DFC = FACC \times (aRC_N - aRC_{EOD}) / (pFACC \times rSOC_{N-1}),$$

where DFC represents a value of said full available charge capacity, FACC represents a value of a full absolute charge capacity of said battery, $aRC_N$ represents a value of said absolute remaining capacity, $aRC_{EOD}$ represents a value of said end-of-discharge remaining capacity, pFACC represents a value of a predetermined full absolute charge capacity of said battery, and $rSOC_{N-1}$ represents a value of a previously determined available state of charge of said battery.

5. The battery management controller of claim 4, wherein said processor is configured to determine said available state of charge based on the following equation:

$$rSOC_N = [(DFC \times rSOC_{N-1}) + Q(t)] / DFC,$$

where $rSOC_N$ represents a value of said available state of charge, and Q(t) represents a value of said number of charges obtained based on said integral value.

6. The battery management controller of claim 1, wherein said memory is configured to store a state-of-charge lookup table that comprises a plurality of data groups, and wherein each data group of said data groups comprises a voltage value and a state of charge corresponding to said voltage value.

7. The battery management controller of claim 6, wherein said processor is configured to perform a plurality of operations comprising:

obtaining, from said second analog-to-digital converter, a first open-circuit voltage of said battery in a first idle state;

searching said state-of-charge lookup table for a first state of charge corresponding to said first open-circuit voltage;

obtaining, from said second analog-to-digital converter, a second open-circuit voltage of said battery in a second idle state;

searching said state-of-charge lookup table for a second state of charge corresponding to said second open-circuit voltage, wherein said battery is in a continuous charging state between said first idle state and said second idle state;

calculating a charge amount of said battery in said charging state; and updating a full absolute charge capacity of said battery according to a ratio of said charge amount to a difference between said second sate of charge and said first state of charge.

8. The battery management controller of claim 7, wherein said processor is configured to update said full absolute charge capacity of said battery according to a charging aging factor of said battery, and wherein said processor is configured to calculate said charging aging factor based on the following equation:

$$AFC = Q(t)_{CHG}/(rSOC_B - rSOC_A),$$

where AFC represents a value of said charging aging factor, $Q(t)_{CHG}$ represents a value of said charge amount, $rSOC_B$ represents a value of said second state of charge, and $rSOC_A$ represents a value of said first state of charge.

9. The battery management controller of claim 8, wherein said processor is configured to update said full absolute charge capacity based on the following equation:

$$FACC = FACC_0 \times (AFC/AFC_0),$$

where FACC represents a value of said full absolute charge capacity, $FACC_0$ represents a value of a previous full absolute charge capacity of said battery, and $AFC_0$ represents a value of a previous charging aging factor of said battery.

10. The battery management controller of claim 1, wherein said processor is configured to perform a plurality of operations comprising:
    obtaining, from said second analog-to-digital converter, an open-circuit voltage of said battery in an idle state;
    obtaining, from said second analog-to-digital converter, a discharge initial voltage of said battery and a discharge current of said battery in a load-on state, wherein said load-on state immediately follows said idle state; and
    updating a full absolute charge capacity of said battery according to a ratio of a difference between said discharge initial voltage and said open-circuit voltage to said discharge current.

11. The battery management controller of claim 10, wherein said processor is configured to update said full absolute charge capacity of said battery according to a discharging aging factor of said battery, and wherein said processor is configured to calculate said discharging aging factor based on the following equation:

$$AFD = (V_D - OCV_C)/I_{DIS},$$

where AFD represents a value of said discharging aging factor, $V_D$ represents a value of said discharge initial voltage, $OCV_C$ represents a value of said open-circuit voltage, and his represents a value of said discharge current.

12. The battery management controller of claim 11, wherein said processor is configured to update said full absolute charge capacity based on the following equation:

$$FACC = FACC_0 \times (AFD/AFD_0),$$

where FACC represents a value of said full absolute charge capacity, $FACC_0$ represents a value of a previous full absolute charge capacity of said battery, and $AFD_0$ represents a value of a previous discharging aging factor of said battery.

13. The battery management controller of claim 1, wherein a speed of conversion of said second analog-to-digital converter is greater than a speed of conversion of said first analog-to-digital converter.

14. The battery management controller of claim 1, further comprising a discharge time database stored in a memory, wherein said discharge time database comprises a plurality of sets of data, and each set of data of said plurality of sets of data comprises a discharge rate, an initial temperature, and an available total discharge time corresponding to said discharge rate and said initial temperature, and wherein said processor is configured to determine a value of said end-of-discharge temperature based on said discharge time database.

15. The battery management controller of claim 14, wherein said processor is configured to determine a value of an assumed initial temperature of said battery based on an absolute state of charge of said battery and a latest discharge rate of said battery, search said discharge time database for an assumed available total discharge time that corresponds to said latest discharge rate and said assumed initial temperature, and determine a value of said end-of-discharge temperature of said battery according to said assumed available total discharge time.

16. A method for determining an available state of charge of a battery, said method comprising:
    integrating an analog signal, indicative of a battery current of said battery, to generate a digital signal indicative of an integral value of said battery current, using a first analog-to-digital converter;
    converting analog signals, indicative of a measured battery voltage, a measured battery current, and a measured battery temperature of said battery, to digital signals using a second analog-to-digital converter;
    receiving, using a processor, said digital signal from said first analog-to-digital converter and said digital signals from said second analog-to-digital converter; and
    accessing, using said processor, a remaining-capacity lookup table stored in a memory, wherein said remaining-capacity lookup table comprises a plurality of groups of data, wherein each group of said groups of data includes a voltage, a current, a temperature, and a parameter associated with a remaining capacity that corresponds to said voltage, said current and said temperature, and wherein said accessing said remaining-capacity lookup table comprises:
        searching said remaining-capacity lookup table for a corresponding parameter value corresponding to said measured battery voltage, said measured battery current, and said measured battery temperature according said digital signals; and
        searching said remaining-capacity lookup table for an end-of-discharge parameter value corresponding to an end-of-discharge voltage, said measured battery current, and an end-of-discharge temperature, wherein said end-of-discharge voltage is indicative for entering an end-of-discharge state to stop said battery from discharging and wherein said end-of-discharge temperature corresponds to a temperature of said battery when said end-of-discharge state is entered,
    wherein said method further comprises:
        determining said available state of charge of said battery based on said integral value, said measured battery voltage, said measured battery current, said measured battery temperature, and said remaining-capacity lookup table, and wherein said determining said available state of charge comprises:
            determining a full available charge capacity of said battery according to a difference between said corresponding parameter value and said end-of-discharge parameter value, wherein said full available charge capacity indicates the number of charges that are discharged from said battery from a time when said battery is fully charged to a time when said battery enters said end-of-discharge state;

obtaining the number of charges flowing through said battery based on said integral value, determining said available state of charge of said battery according to said full available charge capacity and said number of charges obtained based on said integral value; and displaying said available state of charge.

17. The method of claim 16, wherein said parameter comprises a state of charge, said corresponding parameter value comprises an absolute state of charge of said battery, and said end-of-discharge parameter value comprises an end-of-discharge state of charge of said battery, and wherein said method further comprises:

determining said full available charge capacity based on the following equation: DFC=FACC×($aSOC_N$−$aSOC_{EOD}$)/$rSOC_{N-1}$, where DFC represents a value of said full available charge capacity, FACC represents a value of a full absolute charge capacity of said battery, $aSOC_N$ represents a value of said absolute state of charge, and $aSOC_{EOD}$ represents a value of said end-of-discharge state of charge, and $rSOC_{N-1}$ represents a value of a previously determined available state of charge of said battery; and determining said available state of charge based on the following equation: $rSOC_N$=[(DFC×$rSOC_{N-1}$)+Q(t)]/DFC, where $rSOC_N$ represents a value of said available state of charge, and Q(t) represents a value of said number of charges obtained based on said integral value.

18. A battery management system comprising:

sensing circuitry configured to generate analog signals indicative of a measured battery voltage, a measured battery current, and a measured battery temperature of a battery; and a battery management controller, coupled to said sensing circuitry, configured to convert said analog signals to digital signals, and configured to integrate said measured battery current, indicative of a battery current of said battery, to a digital signal indicative of an integral value of said measured battery current, wherein said battery management controller comprises:

a memory configured to store a remaining-capacity lookup table that comprises a plurality of groups of data, wherein each group of said groups of data includes a voltage, a current, a temperature, and a parameter associated with a remaining capacity that corresponds to said voltage, said current and said temperature; a processor coupled to said memory, wherein said processor is configured to receive said digital signal and said digital signals, read data in said remaining-capacity lookup table, and determine an available state of charge of said battery based on said integral value, said measured battery voltage, said measured battery current, said measured temperature, and said remaining-capacity lookup table, wherein said processor determines said available state of charge by: searching said remaining-capacity lookup table for a corresponding parameter value corresponding to said measured battery voltage, said measured battery current, and said measured battery temperature according to said digital signals; searching said remaining-capacity lookup table for an end-of-discharge parameter value corresponding to an end-of-discharge voltage, said measured battery current, and an end-of-discharge temperature, wherein said end-of-discharge voltage is indicative for entering an end-of-discharge state to stop said battery from discharging and wherein said end-of-discharge temperature corresponds to a temperature of said battery when said end-of-discharge state is entered; determining a full available charge capacity of said battery according to a difference between said corresponding parameter value and said end-of-discharge parameter value, wherein said full available charge capacity indicates the number of charges that are discharged from said battery from a time when said battery is fully charged to a time when said battery enters said end-of-discharge state; obtaining the number of charges flowing through said battery according to said integral value; and determining said available state of charge of said battery according to said full available charge capacity and said number of charges obtained based on said integral value flowing through said battery; and a display screen coupled to said battery management controller that displays said available state of charge.

19. The battery management system of claim 18, wherein said parameter comprises a state of charge, said corresponding parameter value comprises an absolute state of charge of said battery, and said end-of-discharge parameter value comprises an end-of-discharge state of charge of said battery, and wherein said processor is configured to determine said full available charge capacity based on the following equation:

$$DFC=FACC \times (aSOC_N - aSOC_{EOD})/rSOC_{N-1},$$

where DFC represents a value of said full available charge capacity, FACC represents a value of a full absolute charge capacity of said battery, $aSOC_N$ represents a value of said absolute state of charge, $aSOC_{EOD}$ represents a value of said end-of-discharge state of charge, and $rSOC_{N-1}$ represents a value of a previously determined available state of charge of said battery.

20. The battery management system of claim 19, wherein said processor is configured to determine said available state of charge based on the following equation:

$$rSOC_N=[(DFC \times rSOC_{N-1})+Q(t)]/DFC,$$

where $rSOC_N$ represents a value of said available state of charge, and Q(t) represents a value of said number of charges obtained based on said integral value.

* * * * *